United States Patent
Iijima

(10) Patent No.: US 6,650,568 B2
(45) Date of Patent: Nov. 18, 2003

(54) METHOD OF READ OPERATION OF NONVOLATILE SEMICONDUCTOR MEMORY AND NONVOLATILE SEMICONDUCTOR MEMORY

(75) Inventor: Mitsuteru Iijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 16 days.

(21) Appl. No.: 10/038,828

(22) Filed: Jan. 8, 2002

(65) Prior Publication Data

US 2002/0118570 A1 Aug. 29, 2002

(30) Foreign Application Priority Data

Feb. 26, 2001 (JP) ......................................... 2001-050124

(51) Int. Cl.$^7$ .............................................. G11C 16/04
(52) U.S. Cl. ............................ 365/185.18; 365/185.03; 365/185.2
(58) Field of Search ...................... 365/185.18, 185.03, 365/185.2

(56) References Cited

U.S. PATENT DOCUMENTS

| | | | |
|---|---|---|---|
| 4,653,023 A | | 3/1987 | Suzuki et al. |
| 4,809,227 A | | 2/1989 | Suzuki et al. |
| 5,526,306 A | | 6/1996 | Hikawa et al. |
| 5,736,771 A | * | 4/1998 | Huang et al. ............... 365/104 |
| 5,796,149 A | * | 8/1998 | Sugaya et al. ............. 257/391 |
| 6,137,726 A | | 10/2000 | Choi et al. |
| 6,188,102 B1 | * | 2/2001 | Tsukiji .................. 365/185.03 |

FOREIGN PATENT DOCUMENTS

EP 0 634 750 A2 1/1995

OTHER PUBLICATIONS

Patent Abstract of Japan, Publication No. 08–274282, publication date Oct. 18, 1996.
Patent Abstracts of Japan, vol. 14, No. 541 (E–1007), Nov. 29, 1990 & JP 02 231772 A, Sep. 13, 1990.
Patent Abstracts of Japan, vol. 17, No. 344 (E–1390), Jun. 29, 1993 & JP 05 048044 A, Feb. 26, 1993.
International Publication No. WO 98/03977 A, published Jan. 29, 1998.
Patent Abstracts of Japan, vol. 1998, No. 05, Apr. 30, 1998 & JP 10 011979 A, Jan. 16, 1998.

* cited by examiner

*Primary Examiner*—Huan Hoang

(57) ABSTRACT

Memory cell currents flowing through memory cells in reading data are compared with reference currents that are set in accordance with the wiring widths of word lines connected to these memory cells. The logic levels of data retained in the memory cells are detected depending on whether larger or smaller the memory cell currents are than the reference currents. Setting a plurality of reference currents for every wiring-width of word lines allows the reference currents to be set at optimum values for each memory cell having different gate widths. Since the reference currents are set according to the characteristic of memory cells, read margins improve for enhanced reliability in read operations.

23 Claims, 17 Drawing Sheets

Prior Art

| operation | selective write | | full chip erase | read | |
|---|---|---|---|---|---|
| memory cell | MC1 | MC2 | | MC1 | MC2 |
| BL1 | 8V | 8V | 15V | 2V | 2V |
| BL2 | 8V | 8V | 15V | 2V | 2V |
| BL3 | 0V | 0V | 15V | 0V | 0V |
| BL4 | 0V | 0V | 15V | 0V | 0V |
| WL11 | 12V | 0V | 0V | 2.5V | 0V |
| WL21 | 0V | 12V | 0V | 0V | 2.5V |
| WL12 | 0V | 0V | 0V | 0V | 0V |
| WL22 | 0V | 0V | 0V | 0V | 0V |

Fig. 5

| operation | selective write | | full chip erase | read | |
|---|---|---|---|---|---|
| memory cell | MC1 | MC2 | | MC1 | MC2 |
| BL1 | 0V | 0V | 6V | 2V | 2V |
| BL2 | 0V | 0V | 6V | 2V | 2V |
| BL3 | 6V | 6V | 6V | 0V | 0V |
| BL4 | 6V | 6V | 6V | 0V | 0V |
| WL11 | 12V | 0V | -5V | 3V | 0V |
| WL21 | 0V | 12V | -5V | 0V | 3V |
| WL12 | 0V | 0V | -5V | 0V | 0V |
| WL22 | 0V | 0V | -5V | 0V | 0V |

Fig. 9

| operation | selective write | | full chip erase | read | |
|---|---|---|---|---|---|
| memory cell | MC1 | MC2 | | MC1 | MC2 |
| BL1 | 0V | 0V | 6V | 2V | 2V |
| BL2 | 0V | 0V | 6V | 2V | 2V |
| BL3 | 6V | 6V | 6V | 0V | 0V |
| BL4 | 6V | 6V | 6V | 0V | 0V |
| WL11 | 12V | 0V | -5V | 3V | 0V |
| WL21 | 0V | 12V | -5V | 0V | 4V |
| WL12 | 0V | 0V | -5V | 0V | 0V |
| WL22 | 0V | 0V | -5V | 0V | 0V |

Fig. 11

| operation | selective write | | | full chip erase | read |
|---|---|---|---|---|---|
| data | "00" | "01" | "10" | "11" | |
| BL1 | 8V | 8V | 8V | 15V | 2V |
| BL2 | 8V | 8V | 8V | 15V | 2V |
| BL3 | 0V | 0V | 0V | 15V | 0V |
| BL4 | 0V | 0V | 0V | 15V | 0V |
| WL11 | 12V | 12V | 0V | 0V | 2.5V |
| WL21 | 12V | 0V | 12V | 0V | 2.5V |
| WL12 | 0V | 0V | 0V | 0V | 0V |
| WL22 | 0V | 0V | 0V | 0V | 0V |

Fig. 14

| operation | selective write | | | full chip erase | read |
|---|---|---|---|---|---|
| data | "00" | "01" | "10" | "11" | |
| BL1 | 0V | 0V | 0V | 6V | 2V |
| BL2 | 0V | 0V | 0V | 6V | 2V |
| BL3 | 6V | 6V | 6V | 6V | 0V |
| BL4 | 6V | 6V | 6V | 6V | 0V |
| WL11 | 12V | 12V | 0V | -5V | 3V |
| WL21 | 12V | 0V | 12V | -5V | 3V |
| WL12 | 0V | 0V | 0V | -5V | 0V |
| WL22 | 0V | 0V | 0V | -5V | 0V |

Fig. 17

METHOD OF READ OPERATION OF NONVOLATILE SEMICONDUCTOR MEMORY AND NONVOLATILE SEMICONDUCTOR MEMORY

BACKGROUND OF THE INVENTION

1. Field of the Invention

The present invention relates to a read operation technique for reading data held in a nonvolatile semiconductor memory.

2. Description of the Related Art

Nonvolatile semiconductor memories such as a flash memory store data by having electrons injected into the insulators of their memory cells for changes in threshold voltage. The memory cells rise in threshold voltage when their insulators contain electrons, and fall when the insulators contain no electron. When the memory cells of a flash memory are to store binary data, a state of high threshold voltage where no current flows through the memory cells in read operations is the state where "data 0" is written ("0 state"). A state of low threshold voltage where currents flow through the memory cells in read operations is the state where "data 1" is written ("1 state").

The "0 state" and the "1 state" are detected by comparing the currents flowing through the memory cells in read operations (memory cell current) with a reference current.

Nonvolatile semiconductor memories of this type are ever growing in memory capacity (memory density) year by year. As a technique for increasing the memory density, level multiplication has been proposed of memory cells. To store multileveled data into each single memory cell, however, the amount of electrons to be injected into the memory cell must be precisely adjusted to secure read margins. In general, it is difficult to adjust the amount of injection of electrons precisely. In the case of storing multileveled data into memory cells by using this technique, small variations in the semiconductor processes can easily cause a drop in yield. Moreover, to store multileveled data into the memory cells, a plurality of reference currents are required for the sake of detecting the logical values of the data. In the meantime, techniques in which the integration level of memory cells is raised by raising the integration level of word lines to heighten storage density have been disclosed in Japanese Unexamined Patent Application Publication No. Hei 2-231772 and so on.

FIG. 1 shows the cell structure of a memory cell array in a nonvolatile semiconductor memory disclosed in this kind of publication.

This nonvolatile semiconductor memory is characterized in that second word lines WL2 having a wiring width different from that of first word lines WL1 are arranged in between these first word lines WL1. The first and second word lines WL1 and WL2, lying over memory cells, function as control gates. Formed under the control gates are floating gates which are shown shaded in the diagram. The floating gates are formed on a silicon substrate via an oxide film, in between bit lines BL which are made of a diffusion layer.

In the diagram, the sources S and drains D of cell transistors (hereinafter, referred to as first memory cells) are formed at the intersections of the first word lines WL1 and the bit lines BL. Then, the channel regions CH of the first memory cells are formed between the sources S and the drains D. Similarly, the sources S and drains D of cell transistors (hereinafter, referred to as second memory cells) are formed at the intersections of the second word lines WL2 and the bit lines BL. The channel regions CH of the second memory cells are formed between the sources S and the drains D.

In this nonvolatile semiconductor memory, after the first word lines WL1 and the floating gates corresponding to these word lines WL1 are formed, the second word lines WL2 and the floating gates corresponding to these second word lines WL2 are formed in the gaps between the first word lines WL1. On that account, the gate width W2 of the second memory cells MC2 becomes smaller than the gate width W1 of the first memory cells MCI. As for the channel lengths (the intervals between the sources S and drains D), the first memory cells MC1 and the second memory cells MC2 are identical to each other.

FIG. 2 shows an equivalent circuit of the memory cell array shown in FIG. 1.

A plurality of first memory cells MC1 are connected in series along the first word lines WL1. The sources S and drains S (data input/output nodes) of adjoining memory cells MC1 are connected to respective common bit lines BL. A plurality of second memory cells MC2 are connected in series along the second word lines WL2. The sources S and drains D (data input/output nodes) of adjoining memory cells MC2 are connected to common bit lines BL This kind of memory cell array is generally referred to as a memory cell array of virtual ground type.

FIG. 3 shows an overview of the read operations of data retained in the memory cells of the nonvolatile semiconductor memory described above.

To read data from a first memory cell MC1, the first word line connected to this memory cell MC1 is supplied with a read voltage of, e.g., 2.5 V. The bit lines BL connected to the source and drain of the first memory cell are supplied with 0 V and 5 V. When the first memory cell MC1 is in the "0 state", the memory cell turns off due to its high threshold voltage, so that no memory cell current flows between the bit lines BL. When the first memory cell MC1 is in the "1 state", the memory cell turns on due to its low threshold voltage, so that a memory cell current flows between the bit lines BL.

Similarly, to read data from a second memory cell MC2, a read voltage of 2.5 V is supplied to a second word line WL2, and 0V and 5V are supplied to bit lines BL on both sides of the second memory cell MC2. When the second memory cell MC2 is in the "0 state", no memory cell current flows. When the second memory cell MC2 is in the "1 state", a memory cell current flows. Then, the memory cell current is compared with a reference current IREF to detect whether the "0 state" or the "1 state" the memory cell MC1 (or MC2) retains.

Nevertheless, as described above, the gate width WI of the first memory cells MC1 is different from the gate width W2 of the second memory cells MC2. The values of the memory cell currents at the turning-on of the cell transistors of the memory cells MC1 and MC2 depend on the ratios W/L between the gate widths W and channel lengths L of the cell transistors. Accordingly, in "1 state" read, the memory cell current of the second memory cells MC2 become smaller than that of the first memory cells MC1.

The reference current IREF needs to be set at between the maximum value and the minimum value of the memory cell currents. This requires that the reference current IREF be set in accordance with the second memory cells MC2 which have a smaller memory cell current in the "1 state". As a result, in the first memory cells MC1, the "0 state" read margin M0 becomes smaller than the "1 state" read margin M1 with a problem of lower reliability.

Conventionally, there has not been proposed any reliable technique for reading data retained in the memory cells of a nonvolatile semiconductor memory that has a plurality of word lines of different wiring widths (gate widths).

SUMMARY OF THE INVENTION

It is an object of the present invention to provide a nonvolatile semiconductor memory having a plurality of word lines of different-wiring widths in which data retained in the memory cells is read with reliability.

It is another object of the present invention to provide a nonvolatile semiconductor memory of virtual ground type in which data retained in the memory cells is read with reliability.

According to one of the aspects of the present invention, memory cell currents flowing through memory cells during data readout are compared with reference currents that are set in accordance with the wiring widths of word lines connected to the memory cells. Then, depending on whether larger or smaller the memory cell currents are than the reference currents, the logic levels of data retained in the memory cells are detected. The word lines also function as control gates of the cell transistors of the memory cells. That is, the wiring widths of the word lines correspond to the gate widths of the cell transistors so that the greater the wiring widths of the word lines are, the lower the ON resistances of the cell transistors become. As a reslt, the values of the memory cell curernts that flow in read operations vary with the wiring widths of the word lines. Setting the reference currents according to the wiring widths of the word lines allows the reference currents to be set at optimum values for the respective memory cells having different gate widths from each other.

For example, when the memory cells are to store binary data, the reference currents for the memory cells having different gate widths are set to the respective middle values between the memory cell currents that flow in reading "logic 1" and the memory cell currents that flow in reading "logic 0". Since the reference currents are set in accordance with the characteristic of memory cells, it is possible to improve the read margins for enhanced reliability in read operations.

The nonvolatile semiconductor memory has, for example, a plurlaty of first word lines arranged with intervals and a plurlaity of second word lines arranged in the respective intervals of these first word lines. The wiring width of the first word lines and the wiring width of the second word lines are different from each other. First memory cells are connected to the first word lines. Second memory cells are connected to the second word lines. The first and second memory cells have, for example, a floating gate for storing electric charge or a trap gate for trapping electric charge.

Then, in reading data from the first memory cell, a memory cell current flowing through this first memory cell is compared with the first reference current to detect the logic level of data retained in the first memory cell. In reading data from the second memory cell, a memory cell current flowing through this second memory cell is compared with the second reference current different from the first reference current to detect the logic level of data retained in the second memory cell.

According to another aspect of the present invention, a first word line is connected to a control gate of a first memory cell which is nonvolatile. A second word line having a wiring width different from that of the first word line is connected to a control gate of a second memory cell which is nonvolatile.

In reading data from the first memory cell, the first word line is supplied with a first voltage, and a memory cell current flowing through this first memory cell is compard with a reference current to detect the logic level of data retained in the first memory cell. In reading data from the second memory cell, the second word line is supplied with a second voltage different from the first voltage, and a memory cell current flowing through this second memory cell is compared with the reference current to detect the logic level of data retained in the second memory cell.

For example, the first voltage and the second voltage are set so that the memory cell currents flowing through the first and second memory cells coincide with each other when data retained in the first and second memory cells has the same logic level. Specifically, if the memory cells are to store binary data, the first voltage and the second voltage are set so that the memory cell currents flowing through the first and second memory cells coincide with each other when the first and second memory cells are programmed for low threshold voltages. Since the memory cell currents of the first and second memory cells (first and second word lines) having different gate widths (wiring widths) can be equal to each other, only a single refrence current is needed for deciding the logic levels of data. As a result, the generator of the reference current can be simply configured, allowing a reduction in the chip size of the nonvolatile semiconductor memory.

By means of the first and second voltages, the memory cell currents of the first and second memory cells corresponding to data of the same logic level can be equal. Therefore, the read margin of the first and second memory cells can be made identical.

According to another aspect of the present invention, first word lines are connected to control gates of first memory cells which are nonvolatile. Second word lines having a wiring width different from that of the first word lines are connected to contorl gates of second memory cells which are nonvolatile. The data written to the nonvolatile semiconductor memory is retained as multileveled data in a pair of first and second memory cells. That is, the pair of first and second memory cells funciton as a multilevel memory cell for retaining multileveled data. When the first and second memory cells retain binary data each, four-level data can be read/written from/to the multilevel memory cell.

In a read operation, the first and second word lines are selected, and memory cell currents corresponding to the respective pieces of data retained in the first and second memory cells flow through the first memory cell and the second ememory cell, respectively. The total amount of memory cell currents flowing through the first and second memory cells (the memory cell current of the multilevel memory cell) is compared with each of a plrualty of reference currents to detect the logic level of the multileveled data.

In conventional memory cells for retaining multileveled data, data was written with the threshold voltages of the memory cells controlled by such means as adjustments to the injection amount of electrons, and the memory cell currents which occurred depending on the threshold voltages were compared with each of a plurality of reference currents. In the present invention, binary data is written to each of the first and second memory cells having different gate widths, and at the time of reading the data, the memory cell currents which occur depending on the shapes (gate widths) of the preformed memory cells are compared with each of a plurality of reference currents. That is, the characteristics of the memory cell made in advance can be utilized to perform read and write operations. Thus, multileveled data can be easily written without a complicated control, improving the read margins at the same time.

According to another aspect of the present invention, a pair of first and second memory cell function as a multilevel memory cell for retaining multileveled data. For example, a first voltage to be supplied to the first word line connected to the first memory cell and a second voltage to be supplied to the second word line connected to the first memory cell are set so that the memory cell currents flowing through the first and second memory cells coincide with each other when data retained in the first and second memory cells has the same logic level. That is, either one of the memory cell currents flowing the first and second memory cells is increased by the first voltage or the second voltage. As a result, the multilevel memory cell configured of the first and second memory cell can be improved in read margin for enhanced reliability in read operations.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is an explanatory diagram showing write conditions, full chip erase conditions, and read conditions of data in the first embodiment;

FIG. 9 is an explanatory diagram showing write conditions, full chip erase conditions, and read conditions of data in the second embodiment;

FIG. 11 is an explanatory diagram showing write conditions, full chip erase conditions, and read conditions of data in the third embodiment;

FIG. 14 is an explanatory diagram showing write conditions, full chip erase conditions, and read conditions of data in the fourth embodiment;

FIG. 17 is an explanatory diagram showing write conditions, full chip erase conditions, and read conditions of data in the fifth embodiment.

DESCRIPTION OF THE PREFERRED EMBODIMENTS

Hereinafter, embodiments of the present invention will be described with reference to the drawings.

Figure 4:
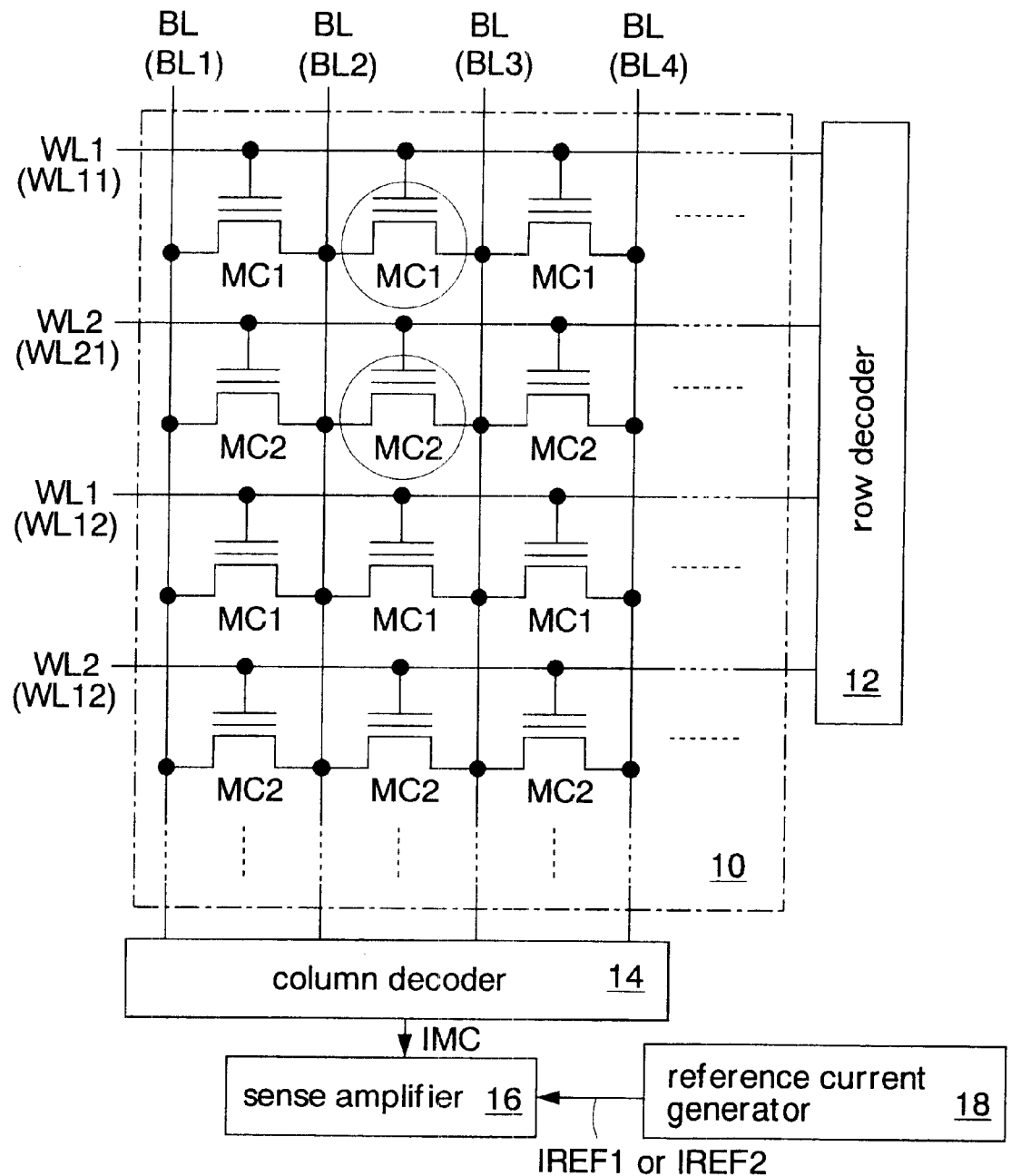
FIG. 4 is a block diagram showing a nonvolatile semiconductor memory according to a first embodiment.

FIG. 4 shows a first embodiment of the method of read operation of a nonvolatile semiconductor memory and the nonvolatile semiconductor memory in the present invention.

This nonvolatile semiconductor memory is formed as a flash memory on a silicon substrate by using CMOS processes. The flash memory has a memory cell array 10, a row decoder 12, a column decoder 14, a sense amplifier 16, and a reference current generator 18, along with not-shown input/output circuits, control circuits, and so on.

The memory cell array 10 is composed of a plurality of first and second memory cells MC1 and MC2 each having a floating gate. The control gates of the first memory cells MC1 are connected to first word lines WL1. The control gates of the second memory cells MC2 are connected to second word lines WL2. More specifically, a plurality of first word lines WL1 is arranged apart from each other. Second word lines WL2 are arranged in the respective gaps between these first word lines WL1. The wiring width of the second word lines WL2 is set at one half that of the first word lines WL1. The wiring widths of the first and second word lines WL1 and WL2 correspond to the gate widths of the cell transistors of the first and second memory cells MC1 and MC2. These cell transistors are identical in channel length and have the same impurity concentration at their channel regions. Therefore, the second memory cells MC2 have an ON resistance twice that of the first memory cells MC1. That is, the ON current of the second memory cells MC2 falls to one half that of the first memory cells MC1.

The plurality of first memory cells MC1 connected to the first word lines WL1 are connected in series. That is, the data input/output nodes (the sources and drains of the cell transistors) of adjoining first memory cells MC1 are connected to each other. Similarly, the plurality of second memory cells MC2 connected to the second word lines WL2 are connected in series. That is, the data input/output nodes (the sources and drains of the cell transistors) of adjoining second memory cells MC2 are connected to each other.

Figure 1:
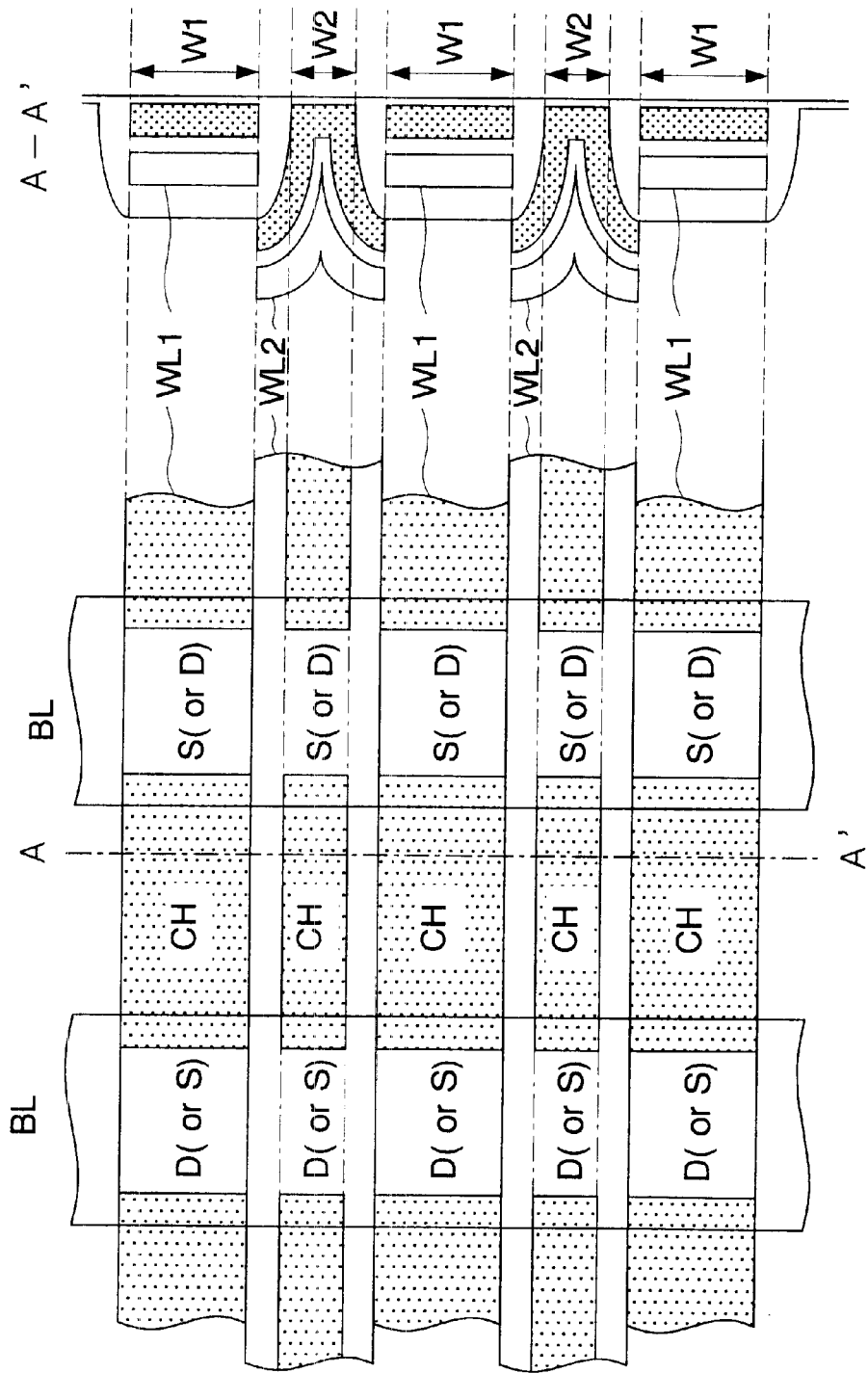
FIG. 1 is a structure diagram of a memory cell array of a conventional nonvolatile semiconductor memory.
Figure 2:
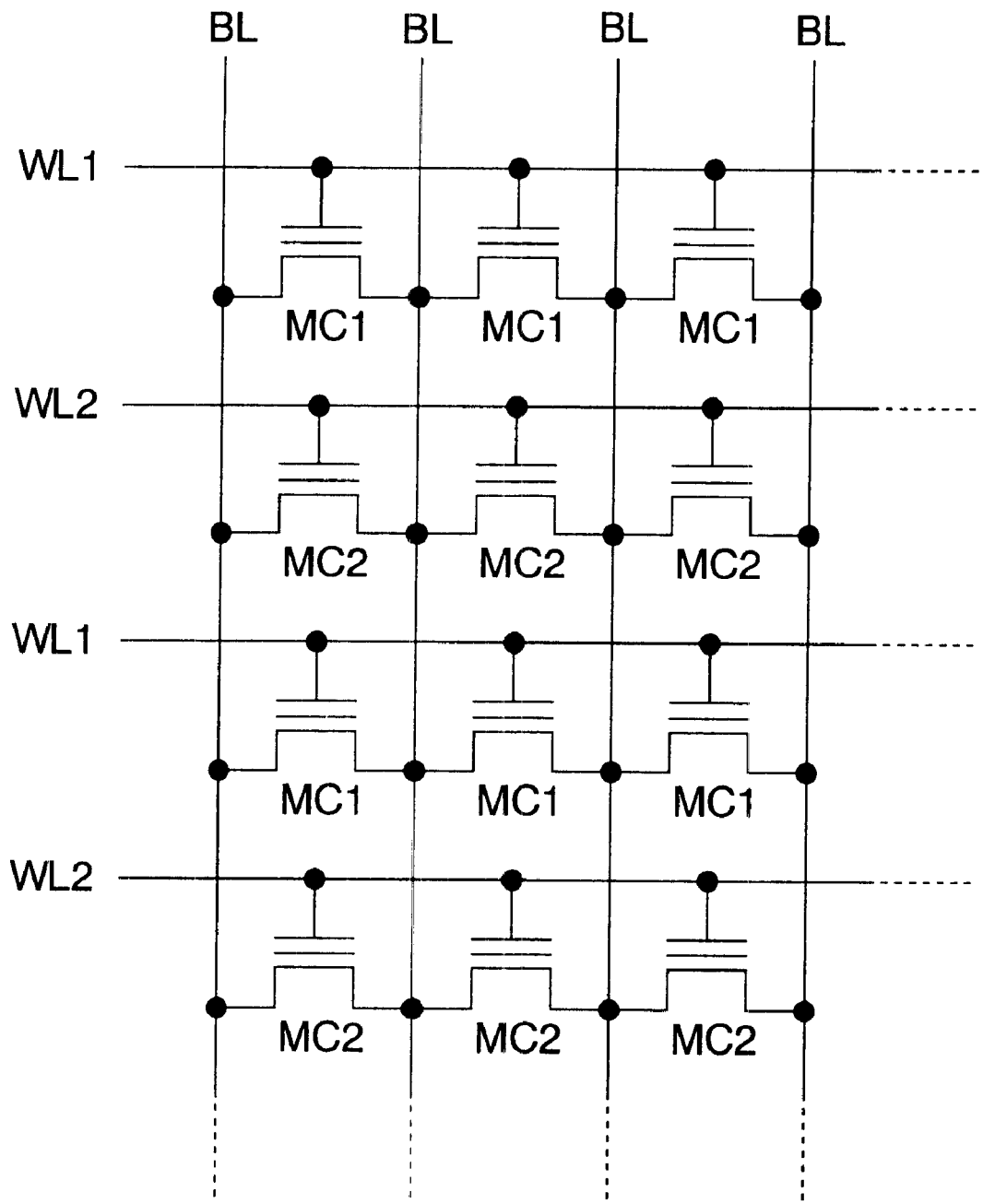
FIG. 2 is an equivalent circuit diagram of FIG. 1.
Figure 3:
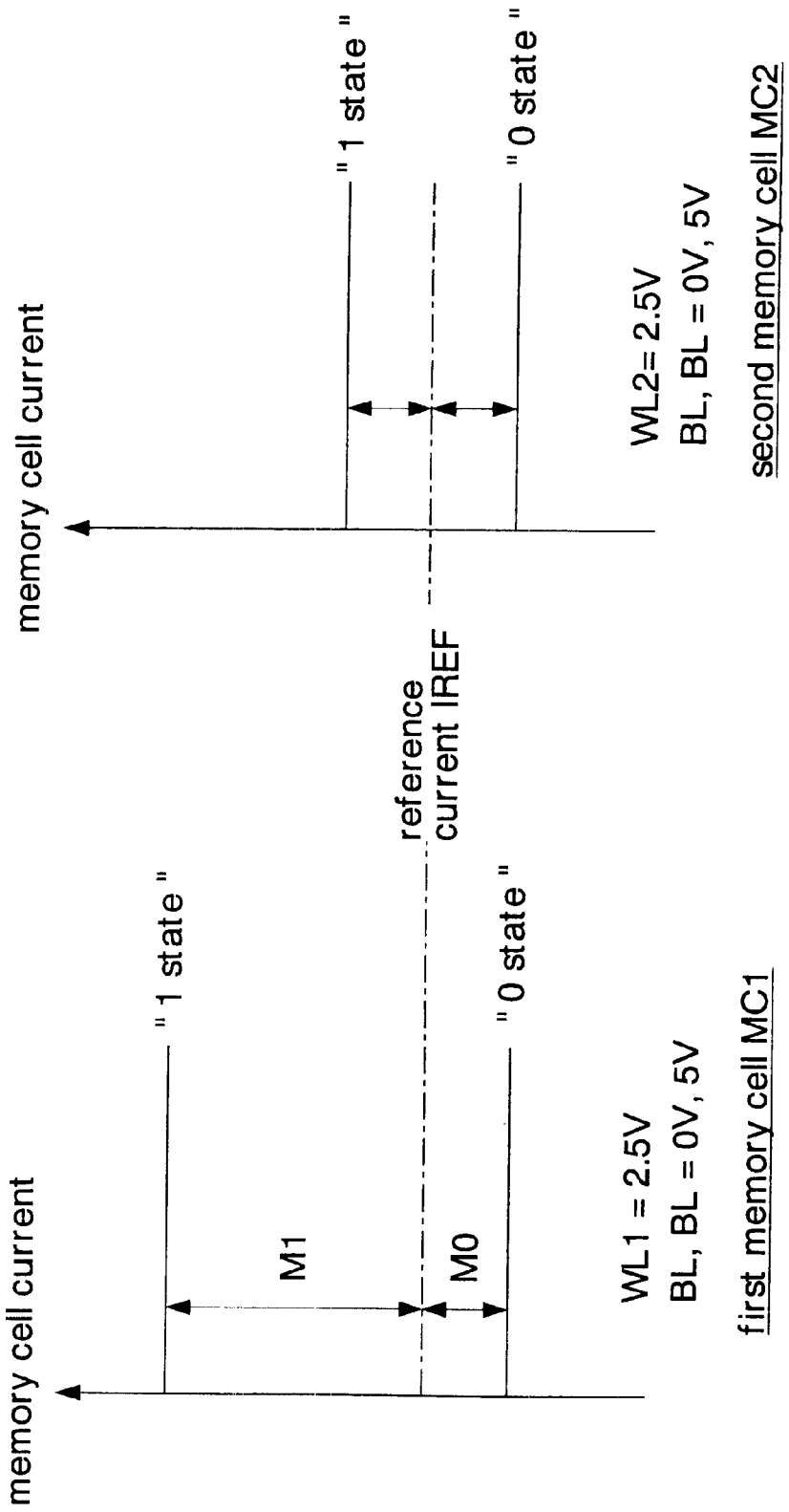
FIG. 3 is an explanatory diagram showing the relationship between the memory cell currents and the reference current in read operations of the conventional nonvolatile semiconductor memory.

A plurality of bit lines BL are arranged orthgonally to the first and second word lines WL1 and WL2. The bit lines BL are connected to the data input/output nodes of the first and second memory cells MC1 and MC2. Thus, the memory cell array 10 of the present embodiment has a plurality of memory cell rows in which the memory cells MC1 (or MC2) are arranged in series. The data input/output nodes of the individual memory cells in these memory cell rows are connected to each other via the bit lines BL. That is, the memory cell array 10 has a structure of so-called virtual ground type. The memory cell array 10 has the same sectional structure as in FIG. 1 described above.

The row decoder 12 activates either of predetermined first and second word lines WL1, WL2 in accordance with a row address which is supplied from the exterior of the chip. The column decoder 14 supplies a high voltage and a low voltage to the bit lines BL on both sides of predetermined memory cells so as to select these memory cells in accordance with a column address which is supplied from the exterior of the chip.

The sense amplifier 16 compares a memory cell current IMC1 (or IMC2) that flows a memory cell MC1 (or MC2) selected by the column decoder 14 and is transmitted through bit lines BL, with a reference current IREF1 (or IREF2). The sense amplifier 16 thereby detects the logic level of data retained in the memory cell.

The reference current generator 18 generates the reference currents IREF1 and IREF2, and supplies either of them to the sense amplifier 16. As will be described later, the reference current IREF1 is larger than the reference current IREF2.

FIG. 5 shows write conditions, full chip erase conditions, and read conditions of data in the first embodiment. The write and read conditions will be described, byway of example, for the case of writing and reading data to/from the first and second memory cells MC1 and MC2 that are marked with an circle in FIG. 4.

In a write operation (selective write), a pair of bit lines BL2 and BL3 on both sides of the first memory cell MC1 (or second memory cell MC2) to which data is written are supplied with 8 V and 0 V, respectively. The bit line BL1 next to the bit line BL2 is supplied with 8 V. The bit line BL4 next to the bit line BL3 is supplied with 0 V. The first word line WL11 (or second word line WL21) connected to the memory cell MC1 (or MC2) to which data is written is supplied with 12 V while the other word lines are grounded. As a result, hot electrons are injected into the floating gate of the memory cell MC1 (or MC2) from the substrate, raising the threshold of the memory cell. It follows that the memory cell enters the "0 state" where "data 0" is written.

In a full chip erase, all the bit lines BL are supplied with 15 V, and all the first and second word lines WL11, WL12, . . . , WL21, WL22, . . . are deselected (0 V). The electrons stored in the floating gates are emitted to the substrate in the form of tunnel currents, so that all the memory cells MC1 and MC2 enter the "1 state" with a low threshold voltage.

In a read operation, a pair of bit lines BL2 and BL3 on both sides of the first memory cell MC1 (or second memory cell MC2) from which data is read are supplied with 2 V and 0 V, respectively. The bit line BL1 next to the bit line BL2 is supplied with 2 V. The bit line BL4 next to the bit line BL3 is supplied with 0 V. The first word line WL11 (or second word line WL21) connected to the memory cell MC1 (or MC2) from which data is read is supplied with 2.5 V. When the memory cell MC1 (or MC2) is in the "1 state", the cell transistor has a low threshold voltage. Therefore, the memory cell current IMC1 (or IMC2) flows between the bit lines BL2 and BL3.

As mentioned above, the gate width of the control gates of the second memory cells MC2 (the wiring width of the second word lines WL2) is smaller than the gate width of the control gates of the first memory cells MC1 (the wiring width of the first word lines WL1). On this account, the memory cell current IMC2 flowing through the second memory cell MC2 becomes smaller than the memory cell current IMC1 flowing through the first memory cell MC1.

When the memory cell MC1 (or MC2) is in the "0 state", the cell transistor has a high threshold voltage. Therefore, no memory cell current IMC1 (or IMC2) flows between the bit lines BL2 and BL3.

To read data retained in the first memory cell MC1, the sense amplifier 16 compares the memory cell current IMC1 with the first reference current IREF1. The data retained in the first memory cell MC1 is decided to be in the "1 state" when the memory cell current IMC1 is larger than the first reference current IREF1, and decided to be in the "0 state" when the current is smaller than the first reference current IREF1. That is, the logic level of the data retained in the first memory cell MC1 is detected.

To read data retained in the second memory cell MC2, the sense amplifier 16 compares the memory cell current IMC2 with the second reference current IREF2. The data retained in the second memory cell MC2 (the state of write of the memory cell) is decided to be in the "1 state" when the memory cell current IMC2 is larger than the second reference current IREF2, and decided to be in the "0 state" when the current is smaller than the second reference current IREF2. That is, the logic level of the data retained in the second memory cell MC2 is detected.

Figure 6:
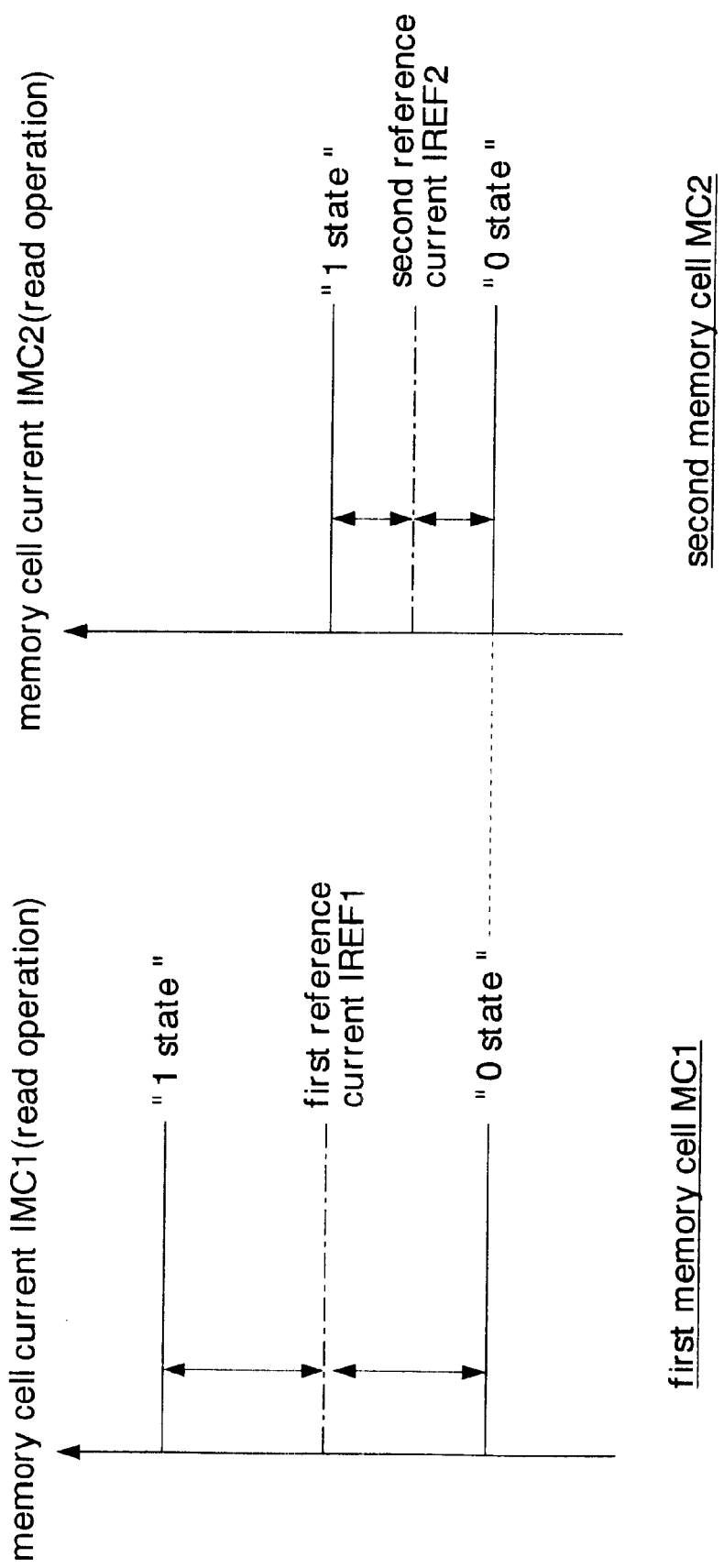
FIG. 6 is an explanatory diagram showing the relationship between the memory cell currents and the reference currents in read operations of the first embodiment.

FIG. 6 shows the relationship between the memory cell currents IMC1, IMC2 and the reference currents IREF1, IREF2 in read operations.

As described above, the memory cell currents IMC1 and IMC2 are compared with the first reference current IREF1 in reading data from a first memory cell MC1 (the left in the diagram) and with the second reference current IREF2 in reading data from a second memory cell MC2 (the right in the diagram), respectively.

The first reference current IREF1 is set at the middle of the memory cell current IMC1 of the first memory cells MC1 in the "1 state" and the memory cell current IMC1 of the first memory cells MC1 in the "0 state". The second reference current IREF2 is set at the middle of the memory cell current IMC2 of the second memory cells MC2 in the "1 state" and the memory cell current IMC2 of the second memory cells MC2 in the "0 state". Accordingly, in the flash memory in which a plurality of word lines WL1 and WL2 are arranged with different wiring widths (the gate widths of the control gates of the cell transistors), the reference currents IREF1 and IREF2 set in accordance with the wiring widths of the word lines WL1 and WL2 are respectively compared with the memory cell currents IMC1 and IMC2 in read operations, so that the "1 state" and "0 state" read margins always coincide with each other irrespective of the magnitudes of the memory cell currents IMC1 and IMC2 which depend on the wiring widths of the word lines WL1 and WL2.

As has been described, in the present embodiment, the memory cell currents IMC1 and IMC2 flowing through the first and second memory cells MC1 and MC2 in reading data are compared with the reference currents IREF1 and IREF2 corresponding to the wiring widths of the first and second word lines WL1 and WL2, respectively. Thus, the reference currents IREF1 and IREF2 can be set at respective optimum values (the values at the middles of the "1 state" and "0 state" memory cell currents IMC) for the memory cells MC1 and MC2 having different gate widths. That is, since the optimum reference currents IREF1 and IREF2 can be set by the characteristics of the memory cells MC1 and MC2, the read margins can be improved for enhanced reliability in read operations.

In particular, the present invention offers a high effect when applied to a nonvolatile semiconductor memory in which element integration level is improved by arranging word lines having a narrower wiring width in the intervals of another word lines.

The application of the present invention requires no change to conventional floating gate type memory cell arrays. Since the present invention can be applied with a modification to the peripheral circuitry alone, it is possible to reduce the design period of the nonvolatile semiconductor memory.

Figure 7:
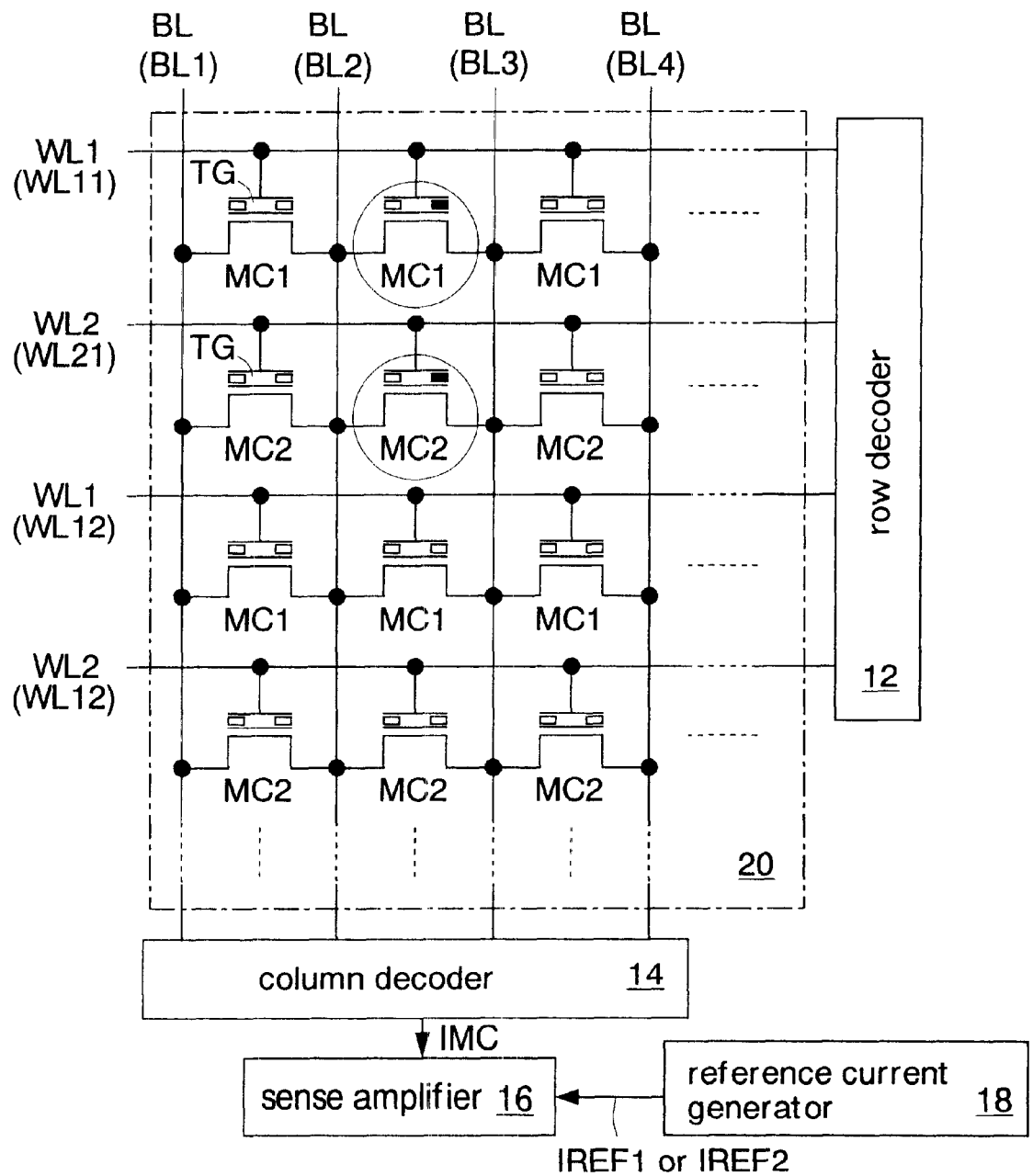
FIG. 7 is a block diagram showing a nonvolatile semiconductor memory according to a second embodiment.

FIG. 7 shows a second embodiment of the method of read operation of a nonvolatile semiconductor memory and the nonvolatile semiconductor memory in the present invention. The same circuits and signals as those described in the first embodiment will be designated by identical reference numbers or symbols. Detailed description thereof will be omitted here.

This nonvolatile semiconductor memory is formed as a flash memory on a silicon substrate by using CMOS processes. The flash memory has a memory cell array 20, a row decoder 12, a column decoder 14, a sense amplifier 16, and a reference current generator 18, along with not-shown input/output circuits, control circuits, and so on.

The memory cell array 10 is composed of a plurality of first and second memory cells MC1 and MC2 each having a trap gate TG. Carriers trapped in a trap gate TG do not move within the trap gate TG. This can be utilized to change the threshold voltages of the cell transistors locally. Therefore, the memory cells MC1 and MC2 of the present embodiment can retain binary data on both the source and drain sides of the channel regions of their trap gates TG. That is, a single memory cell can store multileveled data (of four levels, in this example). In the diagram, the two rectangular regions shown in a memory cell MC1, MC2 retain binary data each. The outlined rectangles show a state where no carrier is trapped (the "1 state" with a low threshold voltage). The filled rectangles show a state where carriers are trapped (the "0 state" with a high threshold voltage).

The control gates of the first memory cells MC1 are connected to first word lines WL1. The control gates of the second memory cells MC2 are connected to second word lines WL2 which have a wiring width narrower than that of the first word lines.

The plurality of first memory cells MC1 connected to the first word lines WL1 are connected in series. That is, the data input/output nodes (the sources and drains of the cell transistors) of adjoining first memory cells MC1 are connected to each other. Similarly, the plurality of second memory cells MC2 connected to the second word lines WL2 are connected in series. That is, the data input/output nodes (the sources and drains of the cell transistors) of adjoining second memory cells MC2 are connected to each other.

A plurality of bit lines BL are arranged orthgonally to the first and second word lines WL1 and WL2. The bit lines BL are connected to the data input/output nodes of the first and second memory cells MC1 and MC2.

The flash memory of the present embodiment is identical to that of the first embodiment except for the cell structure of the first and second memory cells MC1 and MC2 and for not-shown control circuits.

Figure 8:
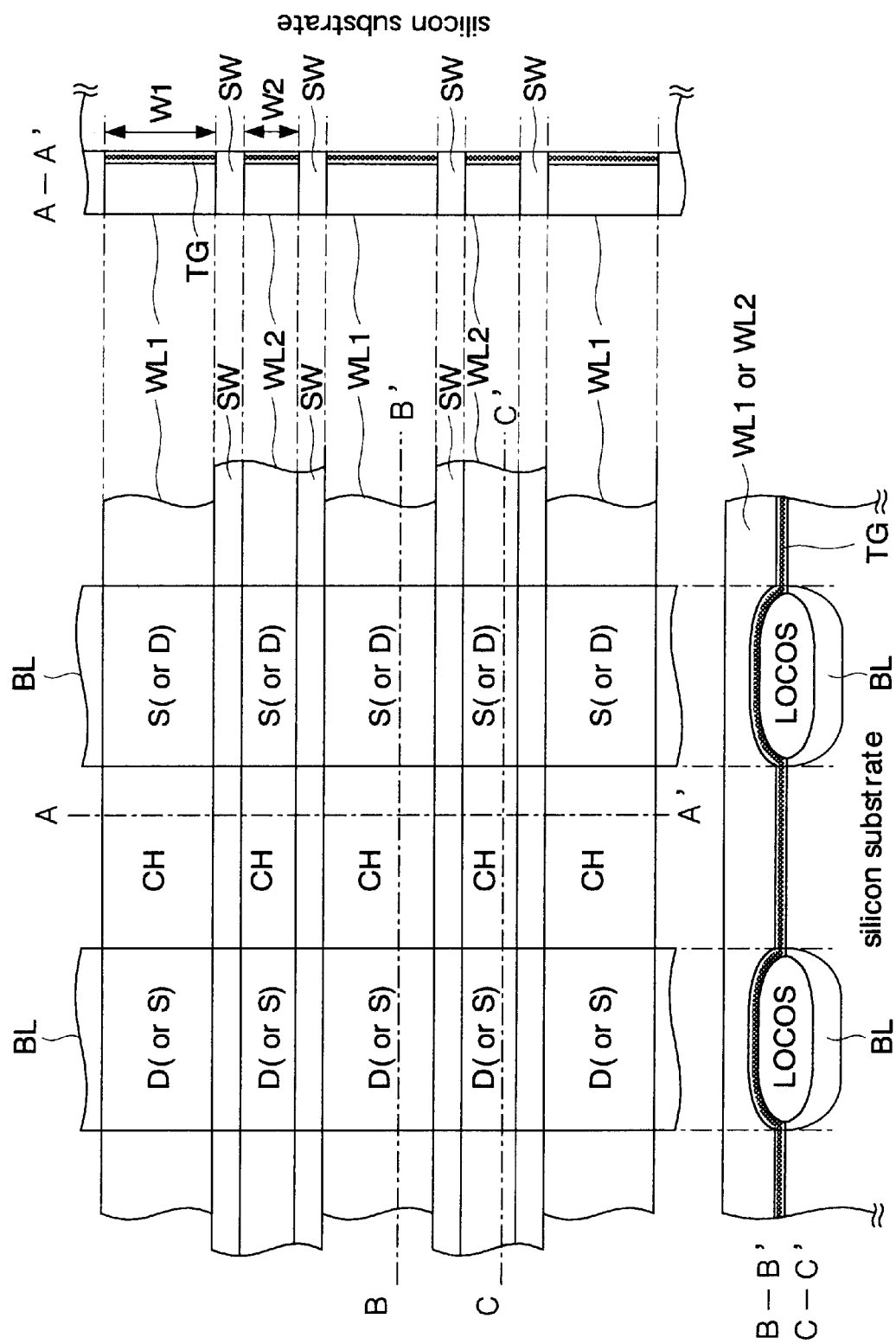
FIG. 8 is a cell structure diagram showing the details of the memory cell array of FIG. 7.

FIG. 8 shows the cell structure of the memory cell array 20 of FIG. 7.

In this flash memory, trap gates TG made of an insulator, capable of trapping carriers are formed in between the first word lines WL1 (or second word lines WL2), which also function as the control gates, and the channel regions CH of the silicon substrate. The trap gates TG have a three-layer structure containing a silicon nitride film sandwiched between silicon oxide films (ONO film). The trap gates TG need not be separated between adjoining memory cells because of no movement of carriers trapped. Therefore, as shown in the B–B' cross section and the C–C' cross section, the trap gates TG are formed to extend in the horizontal direction of the diagram along with the first and second word lines WL1 and WL2. As shown in the A–A' cross section, side walls SW are made of an insulator in between the first word lines WL1 and the second word lines WL2. The control gates of the first memory cells MC1 are connected to first word lines WL1. The control gates of the second memory cells MC2 are connected to second word lines WL2 which have a wiring width narrower than that of the first word lines.

The bit lines BL are formed of a diffusion layer as in the first embodiment. Then, the sources S and drains D of the first and second memory cells MC1, MC2 (cell transistors) are formed at the intersections of the first word lines WL1 and the bit lines BL. The channel regions CH are formed in between the sources S and the drains D.

The following will provide an overview of a method for fabricating the memory cell described above.

Initially, a stripe pattern extending in the bit-line direction is formed at regions where not to form bit lines BL. Using this stripe pattern as a mask, the silicon substrate is selectively implanted with ions to form the bit lines BL. Then, using the stripe pattern as a mask, the silicon substrate is selectively oxidized to form a field oxide film (LOCOS film).

Next, a stripe pattern (regions corresponding to the first word lines WL1) extending in the word-line direction is formed of, for example, a silicon nitride film or the like. The width and intervals of this stripe pattern are made to a minimum processing size. Next, a silicon oxide film is deposited all over the silicon substrate so as to cover the stripe pattern. Subsequently, the silicon oxide film is etched so that the silicon oxide film is left exclusively on both sides of each stripe of the pattern. That is, side walls SW are formed on both sides of each stripe of the pattern. Thereafter, the stripe pattern is removed so that only the side walls SW are left on the silicon substrate.

Next, an ONO film (trap gates TG) is formed all over the silicon substrate. Then, polycrystalline silicon (the material of the first and second word lines WL1 and WL2) is deposited all over the silicon substrate. Subsequently, etchback is performed to remove the upper parts of the polycrystalline silicon and the side walls SW, so that the polycrystalline is left in between the side walls SW. That is, the first and second word lines WL1 and WL2 are formed alternately in between the side walls SW.

In this way, the first and second word lines WL1 and WL2 are formed in a self-aligning fashion under the stripe pattern extending in the word-line direction. Given that the minimum processing size is 0.4 $\mu$m and the width of the side walls is 0.1 $\mu$m, the wiring width W1 of the first word lines WL1 (=the gate width W1 of the control gates of the first memory cells MC1) and the wiring width W2 of the second word lines WL2 (=the gate width W2 of the control gates of the second memory cells MC2) are 0.4 $\mu$m and 0.2 $\mu$m, respectively. The cell transistors of these memory cells MC1 and MC2 are identical in channel length and have the same impurity concentration at their channel regions. Therefore, the ON current of the second memory cells MC2 falls to one half that of the first memory cells MC1.

Since the second word lines WL2 are formed via the side walls in between the first word lines WL1 which are arranged at the minimum processing size, the number of word lines per unit area doubles without a change to the layout design rules.

FIG. 9 shows write conditions, full chip erase conditions, and read conditions of data in the second embodiment. The write and read conditions will be described for the case of writing and reading data to/from the right bit of the first memory cell MC1 or the second memory cell MC2 that are marked with an circle in FIG. 7.

In a write operation (selective write), when electrons are to be injected into the right side of the trap gate TG shown in FIG. 7, a pair of bit lines BL2 and BL3 on both sides of the memory cell MC1 (or MC2) are supplied with 0 V and 6 V, respectively. The bit line BL1 next to the bit line BL2 is supplied with 0 V. The bit line BL4 next to the bit line BL3 is supplied with 6 V. The word line WL11 (or WL21) connected to the memory cell MC1 (or MC2) to which data is written is supplied with 12 V. As a result, the channel of the memory-cell comes into conduction, so that hot electrons are locally injected into a position on the side of bit line BL3 in the trap gate TG. The hot electrons being trapped raise the threshold voltage of the memory cell MC1 (or MC2) at the right side in FIG. 7. The memory cell MC1 (or MC2) enters a "10 state" in which "data 1" is written in the left and "data 0" in the right (for example, "10" in binary).

Incidentally, to inject hot electrons into the left sides of the trap gates of the memory cells shown in FIG. 7,.the bit lines BL1, BL2 and the bit lines BL3, BL4 are supplied contrary to the foregoing, or with 6 V and 0 V, respectively.

In a full chip erase, all the bit lines BL are supplied with 6 V, and all the first and second word lines WL1, WL2 are supplied with −5 V. Then, hot holes are injected into the trap gates TG of the cell transistors from the channel regions CH of the substrate. The hot holes injected are neutralized with preinjected hot electrons, so that all the memory cells MC1, MC2 enter a "11 state" with low threshold voltages (for example, "11 " in binary).

In a read operation, to detect electrons trapped in the right side of the trap gate TG of the memory cell MC1 (or MC2) shown in FIG. 7, the bit line BL2 on the left of the memory cell MC1 (or MC2) is supplied with 2V, and the bit line BL3 on the right is supplied with 0V. The bit line BL1 next to the bit line BL2 is supplied with 2 V. The bit line BL4 next to the bit line BL3 is supplied with 0 V. That is, the memory cell is subjected to an electric field reverse to that of the write operation described above. The first word line WL11 (or second word line WL21) connected to the memory cell MC1 (or MC2) from which data is read is supplied with 3 V. When the right bit of the memory cell MC1 (or MC2) is in the "0 state", the cell transistor has a high threshold voltage and the channel region CH is in a nonconductive state. Therefore, no memory cell current IMC flows between the bit lines BL2 and BL3. When the right bit of the memory cell MC1 (or MC2) is in the "1 state", the cell transistor has a low threshold voltage and the channel region CH is in a conductive state. Therefore, a memory cell current IMC1 (or IMC2) flows between the bit lines BL2 and BL3.

To read data retained in the first memory cell MC1, the sense amplifier 16 compares the memory cell current IMC1 with the first reference current IREF1, as in the first embodiment. The data retained in the first memory cell MC1 is decided to be in the "1 state" when the memory cell current IMC1 is larger than the first reference current IREF1, and decided to be in the "0 state" when the memory cell current IMC1 is smaller than the first reference current IREF1.

To read data retained in the second memory cell MC2, the sense amplifier 16 compares the memory cell current IMC2 with the second reference current IREF2, as in the first embodiment. The data retained in the second memory cell MC2 (the state of write of the memory cell) is decided to be in the "1 state" when the memory cell current IMC2 is larger than the second reference current IREF2, and decided to be in the "0 state" when the memory cell current IMC2 is smaller than the second reference current IREF2.

Incidentally, to detect electrons trapped in the left sides of the trap gates of the memory cells, the bit lines BL1, BL2 and the bit lines BL3, BL4 are supplied contrary to the foregoing, or with 0 V and 2 V, respectively. That is, an electric field reverse to the foregoing is applied to the cell transistors.

As has been described, this embodiment can offer the same effects as those obtained from the foregoing first embodiment. In addition, the present invention is also applicable to a nonvolatile semiconductor memory of trap gate type having the new cell structure as described above. That is, even in the multilevel memory cells of trap gate type, the read margins can be improved for enhanced reliability in read operations as in the memory cells of floating gate type.

Figure 10:
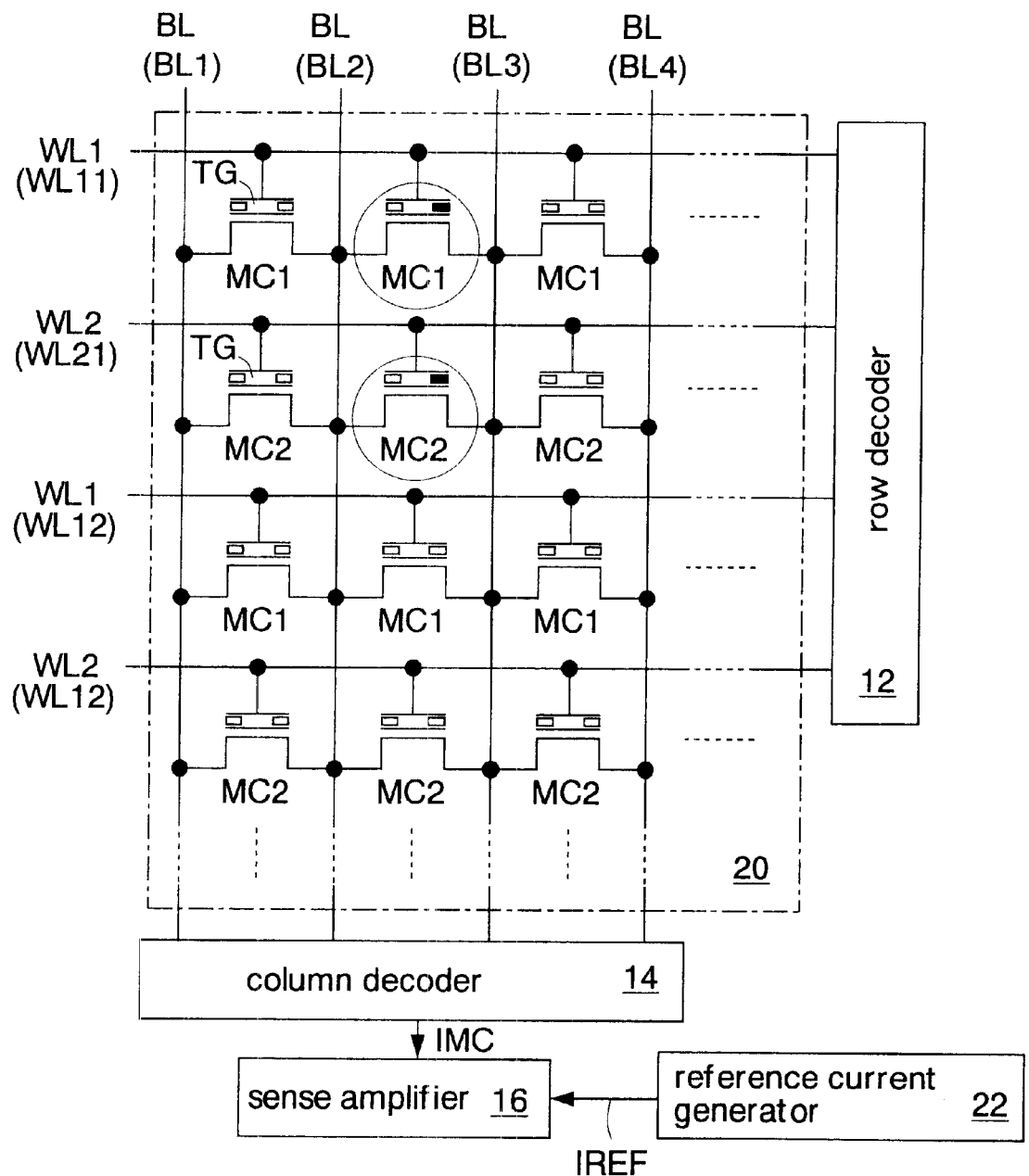
FIG. 10 is a block diagram showing a nonvolatile semiconductor memory according to a third embodiment.

FIG. 10 shows a third embodiment of the method of read operation of a nonvolatile semiconductor memory and the nonvolatile semiconductor memory in the present invention. The same elements as those of the first and second embodiments will be designated by identical reference numbers or symbols. Detailed description thereof will be omitted.

This nonvolatile semiconductor memory is formed as a flash memory on a silicon substrate by using CMOS processes. The flash memory has a reference current 22 instead of the reference current generator 18 of the second embodiment. The reference current generator 22 generates a single reference current IREF. The other configuration is the same as that of the second embodiment (FIG. 7) except for not-shown control circuits. More specifically, first and second memory cells MC1 and MC2 have trap gates TG, so that each single memory cell is capable of storing four-level data (two bits). The wiring width of the second word lines WL2 is set at one half that of the first word lines WL1. The cell transistors of the first and second memory cells MC1 and MC2 are identical in channel length and have the same impurity concentration at their channel regions. Therefore, the ON current of the second memory cells MC2 falls to one half that of the first memory cells MC1.

FIG. 11 shows write conditions, full chip erase conditions, and read conditions of data in the third embodiment. The write and read conditions will be described for the case of writing and reading data to/from the right bit of the first memory cell MC1 or the second memory cell MC2 that are marked with an circle in FIG. 10. This embodiment is characterized by that the second word lines WL2 are supplied with 4 V in read operations, in reading the data retained in the second memory cells MC2. Since the write conditions and full chip erase conditions are the same as in the second embodiment, description thereof will be omitted.

In a read operation of the first memory cell MC1, the bit line BL2 on the left of the first memory cell MC1 is supplied with 2V, and the bit line BL3 on the right is supplied with 0V, to detect the presence or absence of electrons trapped in the right side of the trap gate TG in the diagram. The bit line BL1 next to the bit line BL2 is supplied with 2 V. The bit line BL4 next to the bit line BL3 is supplied with 0 V. The first word line WL11 connected to the memory cell MC1 from which data is read is supplied with 3 V, as in the second embodiment. When the right bit of the first memory cell MC1 is in the "1 state", the cell transistor has a low threshold voltage. Therefore, a memory cell current IMC1 flows between the bit lines BL2 and BL3. When the first memory cell MC1 is in the "0 state", the cell transistor has a high threshold voltage. Therefore, no memory cell current IMC1 flows between the bit lines BL2 and BL3.

In a read operation of the second memory cell MC2, the bit line BL2 on the left of the second memory cell MC2 is supplied with 2V, and the bit line BL3 on the right is supplied with 0V, to detect the presence or absence of electrons trapped in the right side of the trap gate TG in the diagram. The bit line BL1 next to the bit line BL2 is supplied with 2 V. The bit line BL4 next to the bit line BL3 is supplied with 0 V. The second word line WL21 connected to the memory cell MC2 from which data is read is supplied with 4 V. When the right bit of the second memory cell MC2 is in the "1 state", the cell transistor has a low threshold voltage. Therefore, a memory cell current IMC2 flows between the bit lines BL2 and BL3. When the second memory cell MC2 is in the "0 state", the cell transistor has a high threshold voltage. Therefore, no memory cell current IMC2 flows between the bit lines BL2 and BL3.

As described above, in this embodiment, different voltages are applied to the word lines depending on the type of the memory cell to read. More specifically, the voltage of the second word line WL21 in reading the second memory cell MC2 is set so that the memory cell current IMC2 coincides in value with the memory cell current IMC1 that flows when a "1 state" first memory cell MC1 is read.

Figure 12:
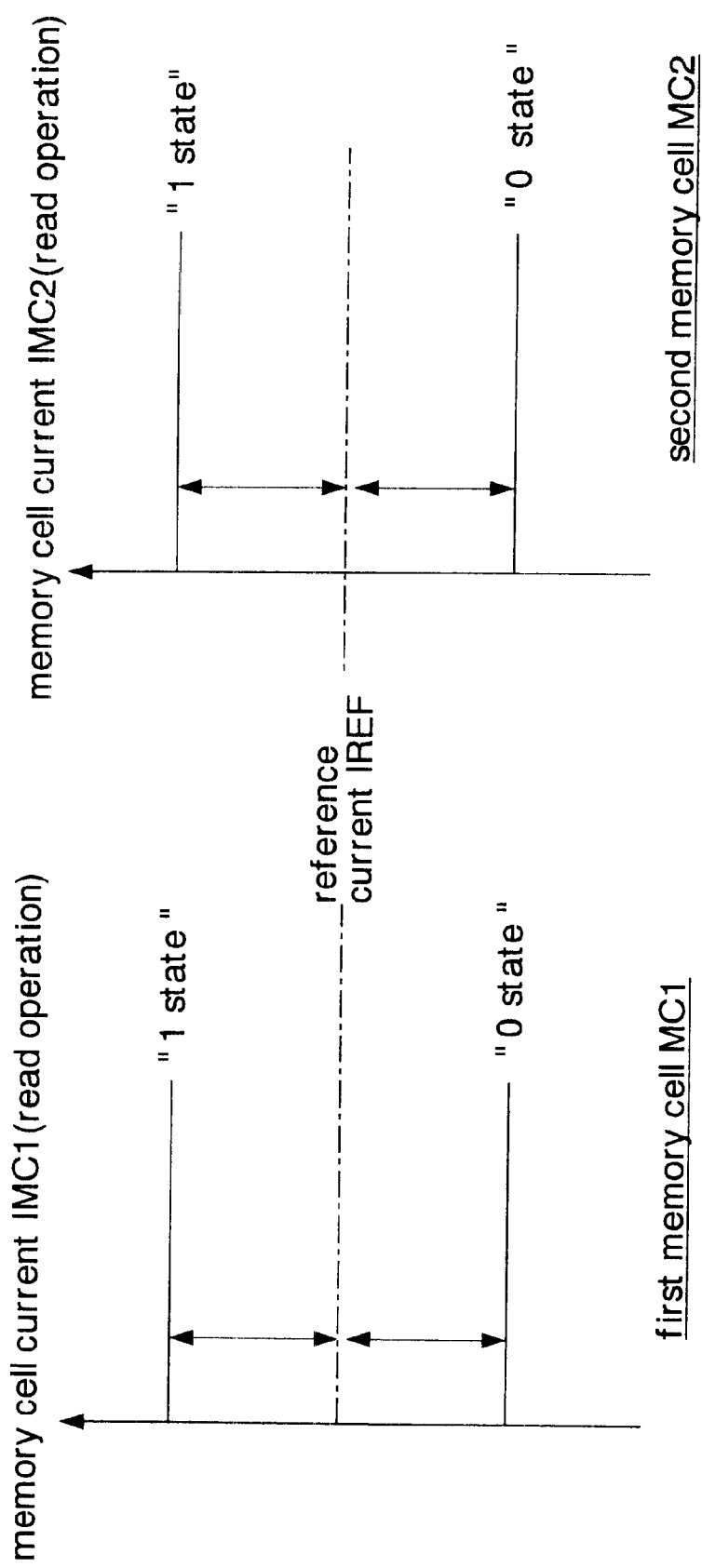
FIG. 12 is an explanatory diagram showing the relationship between the memory cell currents and the reference current in read operations of the third embodiment.

FIG. 12 shows the relationship between the memory cell currents and the reference current in read operations.

According to this embodiment, the memory cell currents IMC1, IMC2 of the first memory cells MC1 and the second memory cells MC2 in the "1 state" and the "0 state" become equal to each other. Therefore, the logic values of data retained in the first and second memory cells MC1 and MC2 can be detected by using one type of reference current IREF alone. The reference current IREF is set at the middle of the "1 state" and "0 state" memory cell currents IMC1, and of the "1 state" and "0 state" memory cell currents IMC2. Therefore, the "1 state" and "0 state" read margins of the first and second memory cells MC1, MC2 become equal.

As has been described, this embodiment can offer the same effects as those obtained from the foregoing first and second embodiments. Furthermore, in read operations, different voltages are applied to the first word lines WL1 and the second word lines WL2 so that the same memory cell currents IMC1 and IMC2 flow when the memory cells MC1 and MC2 of "1 state" are read. This makes it possible to establish equal read margins for logic data retained in the cell transistors having different gate widths (wiring widths of word lines) while using the common reference current IREF. Since the memory cell currents IMC1 and IMC2 of the first and second memory cells MC1 and MC2 (the first and second word lines) having different gate widths (wiring widths) can be made equal, a single reference current can be used for deciding the logic levels of data.

Since the reference current generator 22 has only to generate one type of reference current IREF, it becomes simpler in circuit configuration. This allows a reduction in the chip size of the flash memory. Moreover, as compared with the case of generating a plurality of reference current, the power consumption can be made smaller.

Figure 13:
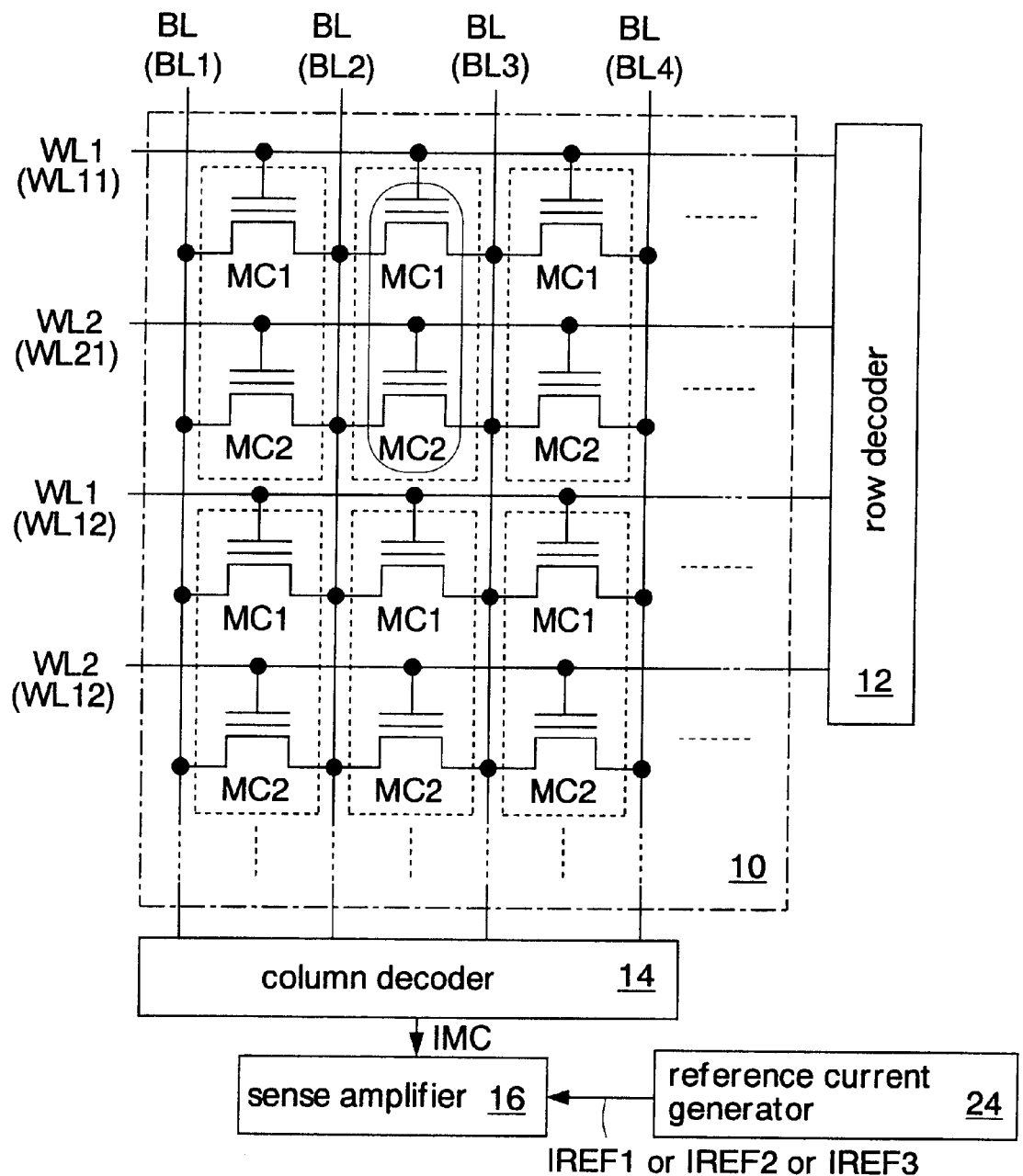
FIG. 13 is a block diagram showing a nonvolatile semiconductor memory according to a fourth embodiment.

FIG. 13 shows a fourth embodiment of the method of read operation of a nonvolatile semiconductor memory and the nonvolatile semiconductor memory in the present invention. The same circuits and signals as those described in the first embodiment will be designated by identical reference numbers or symbols. Detailed description thereof will be omitted here.

This nonvolatile semiconductor memory is formed as a flash memory on a silicon substrate by using CMOS processes. The flash memory has a memory cell array 10, a row decoder 12, a column decoder 14, a sense amplifier 16, and a reference current generator 24, along with not-shown input/output circuits, control circuits, and so on.

As in the first embodiment, the memory cell array 10 is composed of a plurality of first and second memory cells MC1 and MC2 each having a floating gate. The control gates of the first memory cells MC1 are connected to first word lines WL1. The control gates of the second memory cells MC2 are connected to second word lines WL2. The wiring width of the second word lines WL2 is set at one half that of the first word lines WL1. The cell transistors of the first and second memory cells MC1 and MC2 are identical in channel length and have the same impurity concentration at their channel regions. Therefore, the ON current of the second memory cells MC2 falls to one half that of the first memory cells MC1.

The plurality of first memory cells MC1 connected to the first word lines WL1 are connected in series. That is, the data input/output nodes (the sources and drains of the cell transistors) of adjoining first memory cells MC1 are connected to each other. Similarly, the plurality of second memory cells MC2 connected to the second word lines WL2 are connected in series. That is, the data input/output nodes (the sources and drains of the cell transistors) of adjoining second memory cells MC2 are connected to each other.

A plurality of bit lines BL are arranged orthgonally to the first and second word lines WL1 and WL2. The bit lines BL are connected to the data input/output nodes of the first and second memory cells MC1 and MC2.

In the flash memory of the present embodiment, each pair of first and second memory cells MC1 and MC2, shown with broken lines, operate as a multilevel memory cell for storing four-level data. The reference current generator 24 generates three types of reference currents IREF1, IREF2, and IREF3, and supplies any one of them to the sense amplifier 16. The other configuration is the same as that of the first embodiment except for not-shown control circuits.

FIG. 14 shows write conditions, full chip erase conditions, and read conditions of data in the fourth embodiment. The multilevel memory cells, when erased, retain "data 11". When written, the multilevel memory cells retain any of "data 00", "data 01", and "data 10". In this embodiment, each piece of data mentioned above corresponds to binary data. The write and read conditions will be described, by way of example, for the case of writing and reading data to/from the multilevel memory cell that is marked with an ellipse in FIG. 13.

In a write operation (selective write), a pair of bit lines BL2 and BL3 on both sides of the multilevel memory cell to which data is written are supplied with 8 V and 0 V, respectively. The bit line BL1 next to the bit line BL2 is supplied with 8 V. The bit line BL4 next to the bit line BL3 is supplied with 0 V. To write "data 00", both the first word line WL11 and the second word line WL21 are supplied with 12 V, and the other word lines are supplied with a ground voltage (0 V). To write "data 01", the first word line WL11 is supplied with 12V, and the other word lines are supplied with the ground voltage. To write "data 10", the second word line WL21 is supplied with 12 V, and the other word lines are supplied with the ground voltage. As a result, hot electrons are injected into at least either of the floating gates of the memory cells MC1 and MC2 from the substrate, thereby raising the threshold of the memory cell(s). Then, the multilevel memory cell enters a "00 state", "01 state", and "10 state" where the "data 00", "data 01", and "data 10", are written, respectively.

In a full chip erase, all the bit lines BL are supplied with 15 V, and all the first and second word lines WL11, WL12, ..., WL21, WL22, ... are deselected (0 V). Then, all the memory cells MC1 and MC2 enter the "1 state" to bring all the multilevel memory cells into a "11 state".

In a read operation, a pair of bit lines BL2 and BL3 on both sides of the multilevel memory cell from which data is read are supplied with 2 V and 0 V, respectively. The bit line BL1 next to the bit line BL2 is supplied with 2 V. The bit line BL4 next to the bit line BL3 is supplied with 0 V. Both the first word line WL11 and the second word line WL21 connected to the multilevel memory cell are supplied with 2.5 V. Then, the multileveled data retained in the multilevel memory cell is detected according to the total amount of the memory cell currents flowing through the first memory cell MC1 and the second memory cell MC2 in the multilevel memory cell.

Figure 15:
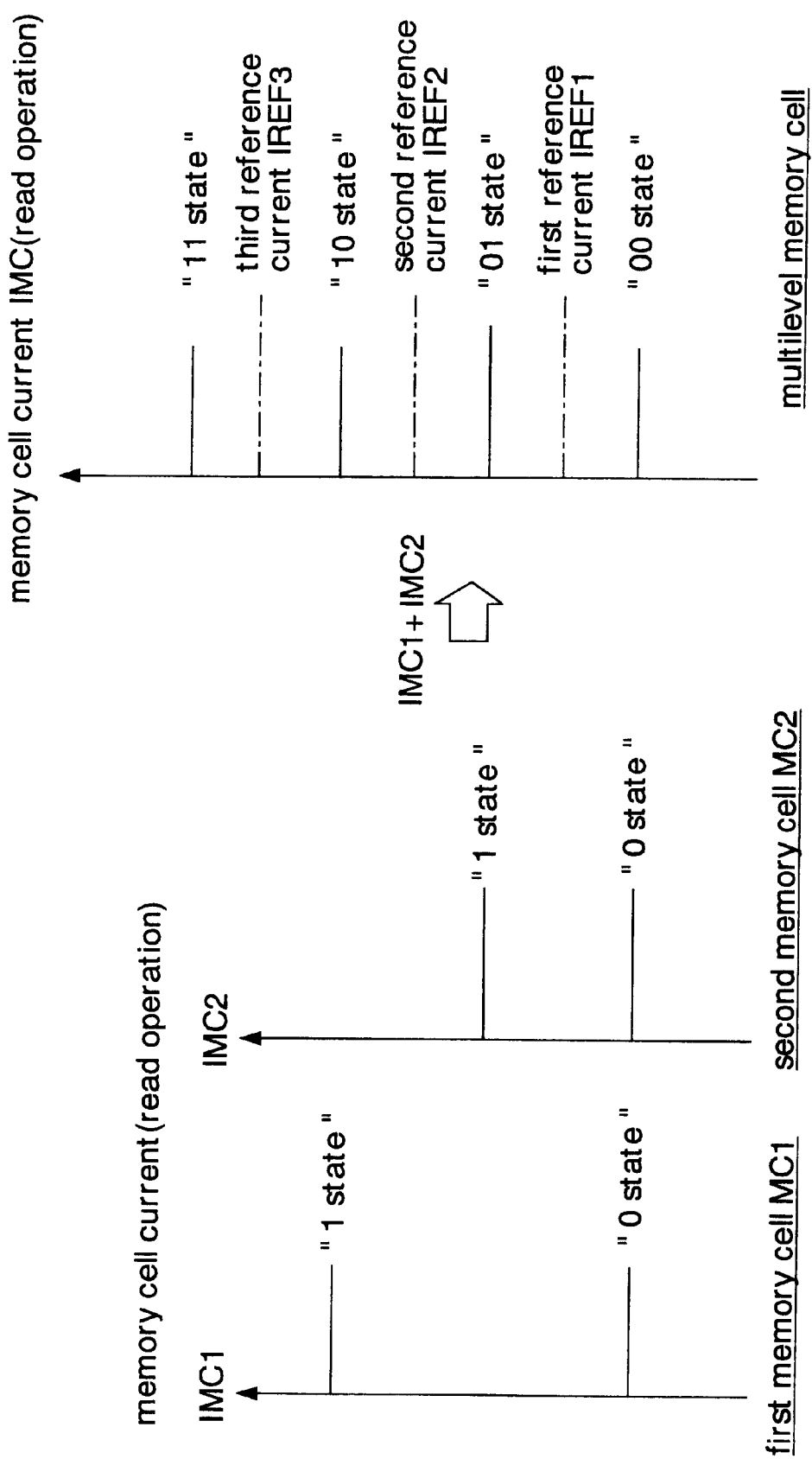
FIG. 15 is an explanatory diagram showing the relationship between the memory cell currents and the reference currents in read operations of the fourth embodiment.

FIG. 15 shows the relationship between the memory cell currents and the reference currents in read operations.

In this embodiment, as mentioned above, the memory cell current IMC1 and the memory cell current IMC2 respectively flowing through a first memory cell MC1 and a second memory cell MC2 in a read operation are summed into the memory cell current IMC of the multilevel memory cell. When the memory cell current IMC is smaller than the first reference current IREF1, it is detected that the "data 00" is retained in the multilevel memory cell (the "00 state"). When the memory cell current IMC falls between the first reference current IREF1 and the second reference current IREF2, it is detected that the "data 01" is retained in the multilevel memory cell (the "01 state"). When the memory cell current IMC falls between the second reference current IREF2 and the third reference current IREF3, it is detected that the "data 10" is retained in the multilevel memory cell (the "10 state"). When the memory cell current IMC is larger than the third reference current IREF3, it is detected that the "data 11" is retained in the multilevel memory cell (the "11 state").

Incidentally, in this embodiment, the voltages to be supplied to the first and second word lines WL1 and WL2 are set so that the "1 state" memory cell current IMC2 of the second memory cells MC2 falls to one half the "1 state" memory cell current IMC1 of the first memory cells MC1. The first reference current IREF1 is set at the middle value between the memory cell current IMC in the "00 state" and the memory cell current IMC in the "01 state". The second reference current IREF2 is set at the middle value between the memory cell current IMC in the "01 state" and the memory cell current IMC in the "10 state". The third reference current IREF3 is set at the middle value between the memory cell current IMC in the "10 state" and the memory cell current IMC in the "11 state". Accordingly, the read margins are identical in any state.

As has been described, the present embodiment can offer the same effects as those obtained from the embodiments described above. Moreover, in the present embodiment, a pair of first and second memory cells MC1 and MC2 having different gate widths are written with binary data each, and in a read operation, the total amount of the memory cell currents IMC1 and IMC2 flowing through the first and second memory cells MC1 and MC2 is compared with each of the plurality of reference currents IREF1, IREF2, and IREF3 to detect the logic level of the multileveled data. That is, a plurality of types of memory cell currents IMC (IMC1+IMC2) to be generated depending on the shapes (gate widths) of the pre-formed memory cells are compared with each of the reference currents IREF1, IREF2, and IREF3. Since the characteristics of the memory cells made up in advance can be utilized to perform read and write operations, it is possible to write multileveled data easily and improve the read margins at the same time. In conventional multilevel memory cells in which the threshold voltages were adjusted through ion implantation, the difficulty of adjusting the amount of ion implantation deteriorated read margins.

The values of the reference currents IREF1, IREF2, and IREF3 are set at between the memory cell currents IMC that flow in the "00 state", "01 state", "10 state", and "11 state". This allows an increase in read margin with respect to each logic level, allowing an improvement in reliability.

The word lines WL1 and WL2 having different wiring widths need not be subjected to separate data decisions using different reference currents upon each read operation. That is, since the reference currents are generated independent of addresses, the reference current generator 24 can be simplified in configuration.

In read operations, the word lines WL1 and WL2 having different wiring widths need not be supplied with different voltages.

Figure 16:
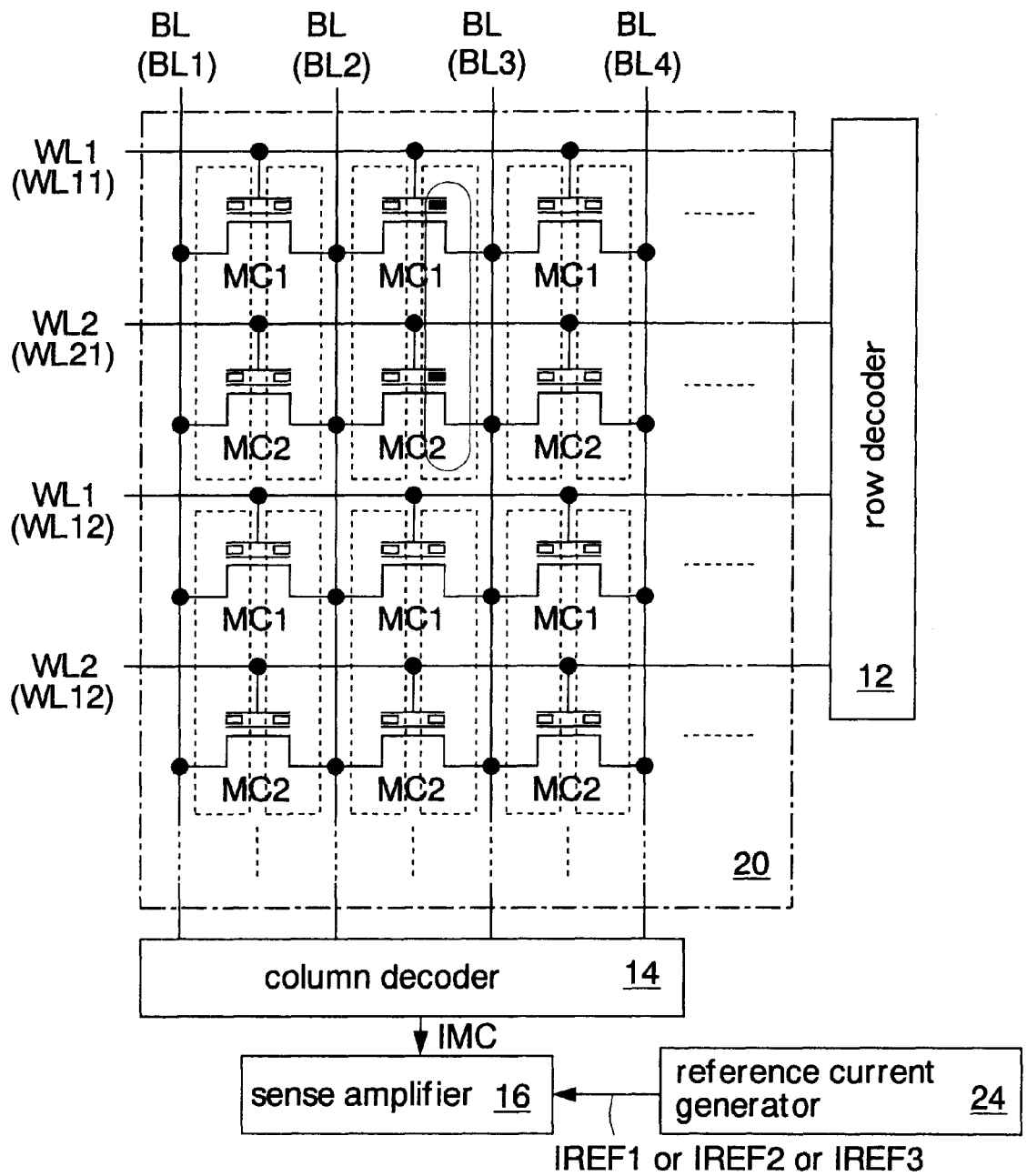
FIG. 16 is a block diagram showing a nonvolatile semiconductor memory according to a fifth embodiment.

FIG. 16 shows a fifth embodiment of the method of read operation of a nonvolatile semiconductor memory and the nonvolatile semiconductor memory in the present invention. The same circuits and signals as those described in the first and second embodiments will be designated by identical reference numbers or symbols. Detailed description thereof will be omitted here.

This nonvolatile semiconductor memory is formed as a flash memory on a silicon substrate by using CMOS processes. The flash memory has a memory cell array 20, a row decoder 12, a column decoder 14, a sense amplifier 16, and a reference current generator 24, along with not-shown input/output circuits, control circuits, and so on.

As in the second embodiment, the memory cell array 20 is composed of a plurality of first and second memory cells MC1 and MC2 each having a trap gate. The control gates of the first memory cells MC1 are connected to first word lines WL1. The control gates of the second memory cells MC2 are connected to second word lines WL2. The wiring width of the second word lines WL2 is set at one half that of the first word lines WL1. The cell transistors of the first and second memory cells MC1 and MC2 are identical in channel length and have the same impurity concentration at their channel regions. Therefore, the ON current of the second memory cells MC2 falls to one half that of the first memory cells MC1.

In the flash memory of the present embodiment, each pair of first and second memory cells MC1 and MC2, as shown by broken lines in the diagram, operate as two multilevel memory cells for storing four-level data each. The reference current generator 24 generates reference currents IREF1, IREF2, and IREF3, and supplies any one of them to the sense amplifier 16. The other configuration is the same as that of the second embodiment (FIG. 7) except for not-shown control circuits.

FIG. 17 shows write conditions, full chip erase conditions, and read conditions of data in the fifth embodiment.

The multilevel memory cells, when erased, retain "data 11". When written, the multilevel memory cells retain any of "data 00", "data 01", and "data 10". In this embodiment, each piece of data mentioned above corresponds to binary data. The write and read conditions will be described, by way of example, for the case of writing and reading data to/from the multilevel memory cell that is marked with an ellipse in FIG. 16 (the cell corresponding to the right sides of the trap gates).

In a write operation (selective write), a pair of bit lines BL2 and BL3 on both sides of the multilevel memory cell to which data is written are supplied with 0 V and 6 V, respectively. The bit line BL1 next to the bit line BL2 is supplied with 0 V. The bit line BL4 next to the bit line BL3 is supplied with 6 V. To write "data 00", both the first word line WL11 and the second word line WL21 are supplied with 12 V, and the other word lines are supplied with a ground voltage (0 V). To write "data 01", the first word line WL11 is supplied with 12 V, and the other word lines are supplied with the ground voltage. To write "data 10", the second word line WL21 is supplied with 12 V, and the other word lines are supplied with the ground voltage. As a result, hot electrons are injected into at least either of the floating gates of the memory cells MC1 and MC2 from the substrate, thereby raising the threshold voltage of the memory cell(s). Then, the multilevel memory cell enters the "0 state", "01 state", and "10 state" where the "data 00", "data 01", and "data 11" are written, respectively.

Incidentally, to inject hot electrons into the multilevel memory cell corresponding to the left sides of the trap gates shown in FIG. 16, the bit lines BL1, BL2 and the bit lines BL3, BL4 are supplied contrary to the foregoing, or with 6 V and 0 V, respectively.

In a full chip erase, all the bit lines BL are supplied with 6 V, and all the first and second word lines WL11, WL12, . . . , WL21, WL22, . . . are supplied with −5 V. Then, all the memory cells MC1 and MC2 enter the "1 state" to bring all the multilevel memory cells into the "11 state".

In a read operation, a pair of bit lines BL2 and BL3 on both sides of the multilevel memory cell from which data is read are supplied with 2 V and 0 V, respectively. The bit line BL1 next to the bit line BL2 is supplied with 2 V. The bit line BL4 next to the bit line BL3 is supplied with 0 V. Both the first word line WL11 and the second word line WL21 connected to the multilevel memory cell are supplied with 3 V. Then, as in the fourth embodiment described above, the total amount of the memory cell currents IMC flowing through the first memory cell MC1 and the second memory cell MC2 in the multilevel memory cell is compared with each of the reference currents IREF1, IREF2, and IREF3, to detect the logic level of the multileveled data retained in the multilevel memory cell.

Incidentally, to read data retained in the multilevel memory cell corresponding to the left sides of the trap gates shown in FIG. 16, the bit lines BL1, BL2 and the bit lines BL3, BL4 are supplied contrary to the foregoing, or with 0 V and 2 V, respectively. That is, the cell transistors of the first and second memory cells MC1 and MC2 are subjected to an electric field reverse to the foregoing one.

As has been described, this embodiment can offer the same effects as those obtained from the foregoing fourth embodiment. Furthermore, even in the multilevel memory cells of trap gate type, the read margins can be improved for enhanced reliability in read operations as in the memory cells of floating gate type.

Incidentally, the foregoing embodiments have dealt with the cases where the wiring width W2 of the second word lines WL2 is set at one half the wiring width W1 of the first word lines WL1 so that the memory cell current of the second memory cells MC2 falls to one half that of the first memory cells MC1. However, the present invention is not limited to such embodiments. The present invention is applicable when a memory cell array has a plurality of word lines having different wiring widths (gate widths of the cell transistors). Besides, the characteristics of the cell transistors come under the narrow channel effect and the reverse narrow channel effect as the elements get finer and the gate widths get narrower. Therefore, the gate widths and the memory cell currents (ON currents) are not necessarily proportional to each other. In such cases, the impurity concentrations of the channel regions CH may be accordingly adjusted by ion implantation or the like, so as to adjust the memory cell currents. In general, the ON currents of the first and second memory cells MC1 and MC2 are more easily adjusted to differ than to coincide.

The foregoing embodiments have dealt with the cases where the present invention is applied to a flash memory having a memory cell array in which two types of word lines WL1 and WL2 are arranged with different wiring widths. However, the present invention is not limited to such embodiments. For example, the present invention may be applied to a flash memory having a memory cell array in which three or more types of word lines are arranged with different wiring widths.

The foregoing embodiments have dealt with the cases where the present invention is applied to a flash memory. However, the present invention is not limited to such embodiments. The present invention may be applied to nonvolatile semiconductor memories of virtual ground type that are electrically rewritable.

The foregoing third embodiment has dealt with the case where the memory cell array 20 is composed of the memory cells MC1 and MC2 each having a trap gate TG. However, the present invention is not limited to such an embodiment. For example, the memory cell array may be composed of memory cells each having a floating gate.

The foregoing fourth and fifth embodiment have dealt with the cases where, in read operations, the memory cell current IMC is compared with the reference currents IREF1, IREF2, and IREF3 to detect the data retained in the memory cells. However, the present invention is not limited to such embodiments. For example, in a read operation, data detection by the sense amplifier 16 may be performed twice to detect the data retained in the memory cells. In this case, the relationship in magnitude between the memory cell current IMC and the second reference current IREF2 is initially detected in the first operation. If the memory cell current IMC is larger than the second reference current IREF2, then in the next operation, the memory cell current IMC is compared with the third reference current IREF3 to detect whether the "11 state" or the "10 state" the multilevel memory cell is in. If the memory cell current IMC is smaller than the second reference current IREF2, then in the next operation, the memory cell current IMC is compared with the first reference current IREF1 to detect whether the "01 state" or the "00 state" the multilevel memory cell is in.

The foregoing fourth and fifth embodiments have dealt with the cases where the multilevel memory cells are composed of first and second memory cells MC1 and MC2 adjoining each other. However, the present invention is not limited to such embodiments. For example, the multilevel memory cell may be composed of first and second memory cells MC1 and MC2 that do not adjoin each other.

The foregoing fourth and fifth embodiments have dealt with the cases where the first and second word lines WL1 and WL2 are supplied with the same voltage in read operations, so as to make a difference between the memory cell current IMC1 of the first memory cell MC1 in the "1 state" and the memory cell current IMC2 of the second memory cell MC2 in the "1 state". However, the present invention is not limited to such embodiments. For example, if there is no sufficient difference between the memory cell currents IMC of the multilevel memory cells in the individual states, which are obtained by summing the memory cell currents IMC1 and IMC2, then the voltage to be applied to the second word line WL2 can be made higher than the one applied to the first word line WL1 as shown in the third embodiment. This allows a further improvement in read margins.

The invention is not limited to the above embodiments and various modifications may be made without departing from the spirit and the scope of the invention. Any improvement may be made in part or all of the components.

What is claimed is:

1. A method of read operation of a nonvolatile semiconductor memory for reading data retained in nonvolatile memory cells respectively connected to word lines having different wiring widths from each other, wherein each of the word lines has the same wiring width on its corresponding memory cells the method comprising the step of comparing memory cell currents flowing through said memory cells during the data readout with reference currents according to the wiring widths of said word lines, and detecting the logic levels of data retained in said memory cells.

2. A method of read operation of a nonvolatile semiconductor memory for reading data retained in first memory cells and second memory cells which are nonvolatile and respectively connected to a first word line and a second word lines having different wiring widths from each other, wherein the first word line has the same wiring width on the first memory cells and the second word line has the same wiring width on the second memory cells the method comprising the steps of:

in reading data form at least one of said first memory cells, comparing a memory cell current flowing through the at least one of said first memory cells with a first reference current and detecting the logic level of data retained in the at least one of said first memory cells; and in reading data from at least one of said second memory cells, comparing a memory cell current flowing through the at least one of said second memory cells with a second reference current different from said first reference current and detecting the logic level of data retained in the at least one of said second memory cells.

3. A method of read operation of a nonvolatile semiconductor memory for reading data retained in first and second memory cells which are nonvolatile and respectively connected to first and second word lines having different wiring widths from each other, the method comprising the steps of:

in reading data from said first memory cell, supplying a first voltage to said first word line, comparing a memory cell current flowing through said first memory cell with a reference current, and detecting the logic level of data retained in said first memory cell; and in reading data from said second memory cell, supplying said second word line with a second voltage different in value from said first voltage, comparing a memory cell current flowing through said second memory cell with said reference current, and detecting the logic level of data retained in said second memory cell.

4. The method of read operation of a nonvolatile semiconductor memory according to claim 3, wherein said first and said second voltages are set so that said memory cell currents coincide with each other when data retained in said first and second memory cells has the same logic level.

5. A method of read operation of a nonvolatile semiconductor memory for reading multileveled data retained in a pairs of first and second memory cells which are nonvolatile and respectively connected to first and second word lines having different wiring widths from each other, wherein the first word line has the same wiring width on the first memory cells and the second word line has the same wiring width on the second memory cells the method comprising the step of in reading data from said pairs of first and second memory cells, comparing memory cell currents flowing through said pairs of first and second memory cells with each of a plurality of reference currents and detecting the logic level of the multileveled data.

6. The method of read operation of a nonvolatile semiconductor memory according to claim 5, wherein in reading data from said first and second memory cells, a first voltage is supplied to said first word line and a second voltage different in value from said first voltage is supplied to said second word line.

7. A nonvolatile semiconductor memory comprising:

a plurality of first memory cells( and a plurality of second memory cells) being nonvolatile;

a plurality of first word lines connected to control gate of said plurality of first memory cell(s); and a plurality of second word lines(o connected to control gate of said plurality of second memory cell(s) and having a wiring width different from that of said first word line wherein:

each of said first word lines has the same wiring width on the first memory cells and each of said second word lines has the same wiring width on the second memory cells in reading data from at least one of said first memory cells, a memory cell current flowing through the at least one of said first memory cells is compared with a first reference current, and the logic level of data retained in the at least one of said first memory cells is detected; and in reading data from at least one of said second memory cells, a memory cell current flowing through the at least one of said second memory cells is compared with a second reference current different from said first reference current, and the logic level of data retained in the at least one of said second memory cell is detected.

8. The nonvolatile semiconductor memory according to claim 7, wherein:

said first word lines are arranged with intervals; and said second word lines are arranged in the respective intervals of said first word lines.

9. The nonvolatile semiconductor memory according to claim 8, wherein:

each of said first word lines is connected to said control gates of said first memory cells connected in series;

each of said second word lines is connected to said control gates of said second memory cells connected in series; and interconnected data input/output nodes in said first memory cells adjacent to each other and interconnected data input/output nodes in said second memory cells adjacent to each other are connected to a plurality of bit lines, respectively.

10. The nonvolatile semiconductor memory according to claim 7, wherein each of said first and second memory cells has a conductive floating gate for storing electric charge.

11. The nonvolatile semiconductor memory according to claim 7, wherein each of said first and second memory cells has an insulative trap gate for trapping electric charge.

12. A nonvolatile semiconductor memory comprising:

a plurality of first memory cell and a plurality of second memory cell being nonvolatile;

a plurality of first word line connected to control gate of said first memory cell and supplied with a first voltage during selection of said first memory cell and a plurality of second word line connected to control gate of said second memory cells and supplied with a second voltage different from said first voltage during selection of said second memory cell, the second word line having a wiring width different from that of said first word line, wherein each of said first word lines has the same wiring width on said first memory cells and each of second word lines has the same wiring width of said second memory cells: and in reading data from either of at least one of said first memory cells and or at least one of said second memory cells, a memory cell current flowing through the at least one of said first memory cells or at lest one of said second memory cells with data read is compared with a reference current, and the logic level of data retained in the at least one of said first memory cells or at least one of said second memory cells with data read is detected.

13. The nonvolatile semiconductor memory according to claim 12, wherein said first and second voltages are set so that memory cell currents flowing through the at least one of said first memory cells and the at least one of said second memory cells coincide with each other when data retained in the at least one of said first memory cells and the at least one of said second memory cells has the same logic level.

14. The nonvolatile semiconductor memory according to claim 12, wherein:

said first word lines are arranged with intervals; and said second word lines are arranged in the respective intervals of said first word lines.

15. The nonvolatile semiconductor memory according to claim 14, wherein:

each of said first word lines is connected to said control gates of said first memory cells connected in series;

each of said second word lines is connected to said control gates of said second memory cells connected in series; and interconnected data input/output nodes in said first memory cells adjacent to each other and interconnected data input/output nodes in said second memory cells adjacent to each other are connected to a plurality of bit lines, respectively.

16. The nonvolatile semiconductor memory according to claim 12, wherein each of said first and second memory cell has a conductive floating gate for storing electric charge.

17. The nonvolatile semiconductor memory according to claim 12, wherein each of said first and second memory cell has an insulative trap gate for trapping electric charge.

18. A nonvolatile semiconductor memory comprising:

a plurality of first memory cell and a plurality of second memory cell being nonvolatile;

a plurality of first word line connected to control gate of said first memory cell; and a plurality of second word lines connected to control gate of said second memory cell and having a wiring width different from that of said first word line, wherein:

each of said first word lines has the same wiring width on said first memory cells and each of said second word lines has the same wiring width on said second memory cells;

multileveled data is retained in a pair of said first and second memory cells; and in reading the multileveled data from said pair of first and second memory cells, memory cell currents flowing through said pair of first and second memory cells are compared with a plurality of reference currents, and the logic level of the multileveled data is detected.

19. The nonvolatile semiconductor memory according to claim 18, wherein in reading the multileveled data, a first voltage is supplied to one of said first word line and a second voltage different in value from said first voltage is supplied to one of said second word lines.

20. The nonvolatile semiconductor memory according to claim 19, wherein:

said first word lines are arranged with intervals; and said second word lines are arranged in the respective intervals of said first word lines.

21. The nonvolatile semiconductor memory according to claim 18, wherein:

each of said first word lines is connected to said control gates of said first memory cells connected in series;

each of said second word lines is connected to said control gates of said second memory cells connected in series; and interconnected data input/output nodes in said first memory cells adjacent to each other and interconnected data input/output nodes in said second memory cells adjacent to each other are connected to a plurality of bit lines, respectively.

22. The nonvolatile semiconductor memory according to claim 18, wherein each of said first and second memory cells has an insulative a conductive floating gate for storing electric charge.

23. The nonvolatile semiconductor memory according to claim 18, wherein each of said first and second memory cells has an insulative trap gate for trapping electric charge.

* * * * *